US007998652B2

(12) United States Patent
Makino et al.

(10) Patent No.: US 7,998,652 B2
(45) Date of Patent: Aug. 16, 2011

(54) LITHOGRAPHIC PRINTING PLATE PRECURSOR AND LITHOGRAPHIC PRINTING METHOD

(75) Inventors: Naonori Makino, Shizuoka (JP); Toshifumi Inno, Shizuoka (JP); Sumiaki Yamasaki, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 10/951,700

(22) Filed: Sep. 29, 2004

(65) Prior Publication Data

US 2005/0074692 A1 Apr. 7, 2005

(30) Foreign Application Priority Data

Sep. 30, 2003 (JP) ................................ 2003-339391

(51) Int. Cl.

| | |
|---|---|
| ***G03C 1/00*** | (2006.01) |
| ***G03C 1/72*** | (2006.01) |
| ***G03F 7/00*** | (2006.01) |
| ***B41F 1/18*** | (2006.01) |
| ***B41F 7/00*** | (2006.01) |
| ***B41N 3/00*** | (2006.01) |
| ***B41M 5/00*** | (2006.01) |

(52) U.S. Cl. ............... 430/270.1; 430/286.1; 430/287.1; 430/288.1; 430/273.1; 430/138; 430/302; 101/450.1; 101/453; 101/463.1

(58) Field of Classification Search ............... 430/270.1, 430/138, 286.1, 287.1, 288.1
See application file for complete search history.

(56) References Cited

U.S. PATENT DOCUMENTS

| | | | | |
|---|---|---|---|---|
| 4,228,232 | A * | 10/1980 | Rousseau | 430/271.1 |
| 5,725,991 | A * | 3/1998 | Gries | 430/258 |
| 5,840,467 | A * | 11/1998 | Kitatani et al. | 430/302 |
| 6,258,510 | B1 | 7/2001 | Maemoto | |
| 6,440,633 | B1 * | 8/2002 | Kawauchi | 430/270.1 |
| 6,497,989 | B1 * | 12/2002 | Nishiyama | 430/300 |
| 6,566,029 | B2 * | 5/2003 | Kawamura et al. | 430/138 |
| 6,566,035 | B1 * | 5/2003 | Aoshima | 430/270.1 |
| 6,607,866 | B1 * | 8/2003 | Kawamura et al. | 430/270.1 |
| 6,670,098 | B1 * | 12/2003 | Kunita | 430/273.1 |
| 6,800,417 | B2 * | 10/2004 | Kikuchi | 430/270.1 |
| 6,855,475 | B2 * | 2/2005 | Szmanda | 430/270.1 |
| 6,884,560 | B2 * | 4/2005 | Yanaka et al. | 430/138 |
| 6,982,140 | B2 * | 1/2006 | Hada et al. | 430/270.1 |
| 2001/0036598 | A1 * | 11/2001 | Shimada et al. | 430/281.1 |
| 2003/0129520 | A1 * | 7/2003 | Oohashi et al. | 430/138 |
| 2003/0224291 | A1 * | 12/2003 | Hatakeyama et al. | 430/270.1 |
| 2004/0185375 | A1 * | 9/2004 | Takahashi et al. | 430/300 |
| 2005/0048398 | A1 * | 3/2005 | Yamasaki et al. | 430/270.1 |
| 2005/0244746 | A1 * | 11/2005 | Makino et al. | 430/270.1 |
| 2007/0298351 | A1 * | 12/2007 | Shimada et al. | 430/281.1 |

FOREIGN PATENT DOCUMENTS

| | | | |
|---|---|---|---|
| JP | 11-84674 | A | 3/1999 |
| JP | 2938397 | B2 | 6/1999 |
| JP | 2000-39711 | A | 2/2000 |
| JP | 2001-205952 | A | 7/2001 |
| JP | 2001-277740 | A | 10/2001 |
| JP | 2001-277742 | A | 10/2001 |
| JP | 2001-312068 | A | 11/2001 |
| JP | 2002-99094 | A | 4/2002 |
| JP | 2002-287334 | A | 10/2002 |

OTHER PUBLICATIONS

Office Action issued on Jun. 8, 2010 in related Japanese Application No. 2004-265735.

* cited by examiner

*Primary Examiner* — Cynthia H Kelly
*Assistant Examiner* — Connie P Johnson
(74) *Attorney, Agent, or Firm* — Birch, Stewart, Kolasch & Birch, LLP

(57) ABSTRACT

A lithographic printing plate precursor comprising: a support; and at least one layer comprising an image-recording layer, the image-recording layer comprising (A) an infrared absorber, (B) a polymerization initiator, (C) a polymerizable compound, and (D) a binder polymer, wherein the image recording layer is capable of being removed with at least one of a printing ink and a fountain solution, wherein at least one of said at least one layer comprises a copolymer having (a1) a unit comprising at least one ethylenically unsaturated bond, and (a2) a unit comprising at least one functional group interacting with a surface of the support. And a lithographic printing method in which the lithographic printing plate precursor is used. The copolymer preferably has a hydrophilic segment. The copolymer preferably is contained in an undercoat layer formed between the support and the image-recording layer.

17 Claims, No Drawings

LITHOGRAPHIC PRINTING PLATE PRECURSOR AND LITHOGRAPHIC PRINTING METHOD

This Nonprovisional application claims priority under 35 U.S.C. §119(a) on Patent Application No(s). Sep. 30, 2003 filed in Japan on 2003-339391, the entire contents of which are hereby incorporated by reference.

BACKGROUND OF THE INVENTION

1. Field of the Invention

The present invention relates to a lithographic printing plate precursor and a lithographic printing method for using the same. More particularly, the invention relates to a lithographic printing plate precursor of the so-called direct plate-making type, from which a printing plate can be directly obtained through scanning with an infrared laser based on digital signals from, e.g., a computer. The invention further relates to a lithographic printing method in which the lithographic printing plate precursor is developed on a printing machine and used to conduct printing.

2. Description of the Related Art

A lithographic printing plate generally has ink-receptivity image areas, which receive an ink during printing, and hydrophilic non-image areas, which receive a fountain solution. Lithography is a process in which the surface of a lithographic printing plate is made to have a difference in ink adhesion by forming ink-receptivity image areas as ink-receiving areas and hydrophilic non-image areas as fountain-solution-receiving areas (non-ink-receiving areas) based on the fact that water has the property of repelling oil-based inks, and an ink is adhered only to the image areas and then transferred to a material to be printed, e.g., paper, to conduct printing.

A lithographic printing plate precursor (PS plate) comprising a hydrophilic support and an ink-receptivity photosensitive resin layer (image-recording layer) formed thereon has hitherto been in wide use for producing such lithographic printing plate therefrom. Usually, a lithographic printing plate is produced from a lithographic printing plate precursor by a method which comprises exposing the precursor through an original, e.g., a lith film, and then dissolving and removing the image-recording layer in the non-image areas with an alkaline developing solution or organic solvent to thereby expose the corresponding surface of the hydrophilic support while leaving the image-recording layer in the image areas.

Such platemaking processes heretofore in use for producing a printing plate from a lithographic printing plate precursor necessitate a step in which the non-image areas after exposure are dissolved and removed with a developing solution or the like suitable for the image-recording layer. However, to eliminate or simplify such a wet treatment performed additionally is one of the subjects to be accomplished. In particular, the discard of waste liquids resulting from wet treatments has recently become a matter of considerable concern of the whole industrial world from the standpoint of care of the global environment and, hence, there is an increasingly growing desire for the accomplishment of that subject.

For this purpose, a technique called on-press development has been proposed as a simple platemaking method. This technique uses a lithographic printing plate precursor having an image-recording layer whose non-image areas can be removed in an ordinary printing process. After exposure, the non-image areas are removed on a printing machine to obtain a lithographic printing plate.

Examples of the on-press development include: a method which uses a lithographic printing plate precursor having an image-recording layer capable of being dissolved or dispersed in a fountain solution or ink solvent or in a fountain solution/ink emulsion; a method in which an image-recording layer is mechanically removed by contact with rollers or the blanket cylinder of a pressing machine; and a method in which the cohesive force of an image-recording layer or adhesion between the image-recording layer and the support is reduced by the penetration of a fountain solution, ink solvent, or the like and, thereafter, the image-recording layer is mechanically removed by contact with rollers or the blanket cylinder.

On the other hand, digitization technology in which image information is electronically processed, accumulated, and outputted by a computer has recently come to spread extensively, and various new image output techniques suitable for such digitization technology have come to be practically used. Under these circumstances, attention is focused on a computer-to-plate technique in which a highly convergent radiation such as a laser light is caused to carry digitized image information and this light is used to scan and expose a lithographic printing plate precursor to directly produce a lithographic printing plate without via a lith film. Consequently, to obtain a lithographic printing plate precursor suitable for such a technique has become one of important technical subjects.

As described above, simplification of platemaking and use of a dry platemaking process and no development step have recently come to be more strongly desired than before from the standpoints of care of the global environment and suitability for digitization.

However, in the case where the conventional image-recording method, which utilizes a light having wavelengths from the ultraviolet to visible region, is used for the simplification of a platemaking operation, such as on-press development, the image-recording layer remains unfixed after exposure and hence retains sensitivity to indoor light. It has therefore been necessary that the lithographic printing plate precursor taken out of a package should be kept in a completely light-shielded state until on-press development is completed.

High-output lasers such as a semiconductor laser emitting infrared rays having a wavelength of from 760 to 1,200 nm and a YAG laser have recently become available at low cost. Because of this, a easy process for lithographic printing plate production to be incorporated into digitations technology, using any of these high-output lasers as a light source for image recording through scanning exposure is coming to be regarded as a promising process.

In the conventional platemaking process using a light having wavelengths from the ultraviolet to visible region, a photosensitive lithographic printing plate precursor is imagewise exposed at a low to medium illuminance to record an image based on an imagewise property change caused by a photochemical reaction in the image-recording layer. In contrast, in the above-described process using a high output laser, a large quantity of light energy is applied to exposed areas in an extremely short time period to efficiently convert the light energy to heat energy and the image-recording layer is caused by this heat to thermally undergo a change such as a chemical change, phase change, or change in form or structure. This change is utilized for image recording. Consequently, although image information is inputted by means of light energy such as laser light, image recording is influenced not only by the light energy but also by the reaction caused by heat energy. Usually, the recording technique utilizing the heat generated by such high-power-density exposure is called heat mode recording, and the conversion of light energy into heat energy is called light/heat conversion.

Great merits of platemaking processes employing heat mode recording are that the image-recording layer is not sensitive to light on an ordinary illuminance level, such as indoor light, and that an operation for fixing the image recorded by high-illuminance exposure is not essential. Namely, there is no possibility that the lithographic printing plate precursor for use in heat mode recording might be influenced by indoor light before exposure, and it is not essential to conduct an operation for image fixing after exposure. Consequently, when a platemaking process, in which an image-recording layer which is insolubilized or solubilized by exposure using, e.g., a high-output laser and the exposed image-recording layer is made to bear an imagewise to thereby produce a lithographic printing plate, is conducted during on-press development, then a printing system is expected to be possible in which the image is not influenced even when the image-recording layer after the exposure is exposed to indoor ambient light. This system is desired to be realized.

Known as such a lithographic printing plate precursor is, for example, a lithographic printing plate precursor comprising a hydrophilic support and, formed thereon, an image-forming layer comprising a hydrophilic binder and hydrophobic thermoplastic polymer particles dispersed therein (see, for example, Japanese Patent No. 2938397). This lithographic printing plate precursor can be used in the following manner. The precursor is exposed with an infrared laser to thermally fusion-bond the hydrophobic thermoplastic polymer particles to one another and thereby form an image. Thereafter, this precursor is attached to the cylinder of a printing machine, and a fountain solution and/or an ink is supplied thereto to develop the image-forming layer by on-press development.

However, the technique described above in which an image is formed by the mere bonding of fine polymer particles by thermal fusion has been disadvantageous in that image strength is considerably low and printing durability is insufficient, although the lithographic printing plate precursor shows satisfactory on-press developability.

A technique for improving the printing durability of such a lithographic printing plate precursor capable of on-press development has been proposed. It is a lithographic printing plate precursor characterized in that it comprises a hydrophilic support and, formed thereover, a heat-sensitive layer containing microcapsules containing a compound having a functional group reacting by the action of heat, and that an infrared absorber is contained in either the heat-sensitive layer or a layer adjacent thereto (see JP-A-2001-277740 and JP-A-2001-277742).

Another technique for improving printing durability is known. It is a lithographic printing plate precursor capable of on-press development which comprises a support and formed thereon a photosensitive layer comprising an infrared absorber, a radical polymerization initiator, and a polymerizable compound (see JP-A-2002-287334).

Those techniques utilizing a reaction such as polymerization reaction can attain an improvement in image strength because the image areas have a higher chemical-bond density than the image areas formed by the thermal fusion bonding of fine polymer particles. However, those techniques have been still insufficient from the standpoint of satisfying both of on-press developability and thin-line reproducibility or printing durability.

SUMMARY OF THE INVENTION

An object of the invention, which has been achieved in view of the related-art techniques described above, is to provide a lithographic printing plate precursor excellent in on-press developability, thin-line reproducibility, and printing durability. Another object of the invention is to provide a lithographic printing method in which the lithographic printing plate precursor is used.

The present inventor made intensive investigations in order to accomplish those objects. As a result, it has been found that those objects are accomplished by incorporating a copolymer containing a specific group into the image-recording layer or another layer of a lithographic printing plate precursor. The invention has been thus completed.

The invention provides the following.

(1) A lithographic printing plate precursor comprising:

a support; and at least one layer comprising an image-recording layer, the image-recording layer comprising (A) an infrared absorber, (B) a polymerization initiator, (C) a polymerizable compound, and (D) a binder polymer, wherein the image recording layer is capable of being removed with at least one of a printing ink and a fountain solution, wherein at least one of said at least one layer comprises a copolymer having (a1) a unit comprising at least one ethylenically unsaturated bond, and (a2) a unit comprising at least one functional group interacting with a surface of the support.

(2) The lithographic printing plate precursor described in (1) above, wherein the copolymer has a property of being adsorbed onto an anodized film of an aluminum in an amount of 0.1 $mg/m^2$ or larger.

(3) The lithographic printing plate precursor described in (1) or (2) above, wherein the copolymer further has (a3) a unit comprising at least one hydrophilic group.

(4) The lithographic printing plate precursor described in (3) above, wherein a logP of the unit (a3) is from −3 to 3.

(5) The lithographic printing plate precursor described in any of (1) to (4) above, wherein said at least one layer further comprises an undercoat layer formed between the support and the image-recording layer.

(6) The lithographic printing plate precursor described in any of (1) to (5) above, wherein the image-recording layer further comprises a microcapsule including at least one of (A) the infrared absorber, (B) the polymerization initiator, (C) the polymerizable compound, and (D) the binder polymer.

(7) The lithographic printing plate precursor described in (1) above, wherein the unit (a1) is represented by formula (A1)

(A1)

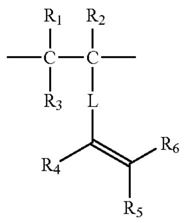

in which $R_1$ to $R_3$ each independently represents a hydrogen atom, an alkyl group having 1 to 6 carbon atoms, or a halogen atom;

$R_4$ to $R_6$ each independently represents a hydrogen atom, an alkyl group having 1 to 6 carbon atoms, a halogen atom, an acyl group, or an acyloxy group, wherein $R_5$ may be bonded to one of $R_4$ and $R_6$ to form a ring; and L represents a bivalent connecting group selected from the group consisting of —CO—, —O—, —NH—, bivalent aliphatic groups, bivalent aromatic groups, and combinations of two or more of these.

(8) The lithographic printing plate precursor described in (1) or (7) above, wherein the unit (a2) is represented by formula (A2)

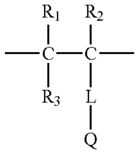

(A2)

in which $R_1$ to $R_3$ each independently represents a hydrogen atom, an alkyl group having 1 to 6 carbon atoms, or a halogen atom;

L represents a bivalent connecting group selected from the group consisting of —CO—, —O—, —NH—, bivalent aliphatic groups, bivalent aromatic groups, and combinations of two or more of these; and Q represents a functional group interacting with the surface of the support.

(9) The lithographic printing plate precursor described in (3) or (4) above, wherein the unit (a3) is represented by formula (A3):

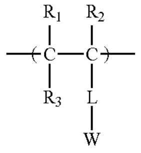

(A3)

in which $R_1$ to $R_3$ each independently represents a hydrogen atom, an alkyl group having 1 to 6 carbon atoms, or a halogen atom;

L represents a bivalent connecting group selected from the group consisting of —CO—, —O—, —NH—, bivalent aliphatic groups, bivalent aromatic groups, and combinations of two or more of these; and W represents the following groups:

$—COO—M_1$, $—SO_3—M_1$, 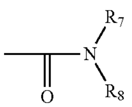 , $—(R_9—O)_n—R_{10}$.

in which $M_1$ represents a hydrogen atom, an alkali metal atom, an alkaline-earth metal atom, or an ammonium;

$R_7$ and $R_8$ each independently represents a hydrogen atom or a linear or branched alkyl group having 1 to 6 carbon atoms;

$R_9$ represents a linear or branched alkylene group having 1 to 6 carbon atoms;

$R_{10}$ represents a hydrogen atom or an alkyl group having 1 to 12 carbon atoms; and.

Symbol n represents an integer of 1 to 100.

(10) The lithographic printing plate precursor described in any of (1) to (9) above, wherein (B) the polymerization initiator is at least one selected from the group consisting of an iodonium salt, a diazonium salt, and a sulfonium salt.

(11) The lithographic printing plate precursor described in any of (1) to (10) above, further comprising an overcoat layer, so as to comprise the support, said at least one layer, and the overcoat layer, in this order, wherein the overcoat layer is capable of being removed with at least one of the printing ink and the fountain solution.

(12) A lithographic printing method comprising:

mounting a lithographic printing plate precursor according to any of (1) to (11) above on a printing press;

imagewise exposing the lithographic printing plate precursor with an infrared laser beam; and feeding a printing ink and a fountain solution to the lithographic printing plate precursor to remove an infrared non-exposed area in the image recording layer.

(13) The lithographic printing method described in (12) above, wherein the mounting is performed before the imagewise exposing.

(14) The lithographic printing method described in (12) above, wherein the mounting is performed after the imagewise exposing.

In the present invention, it is noted that the mounting of the lithographic printing plate precursor to the printing press may be performed either before or after the imagewise exposing of the lithographic printing plate precursor.

DETAILED DESCRIPTION OF THE INVENTION

The invention will be explained below in detail.

The lithographic printing plate precursor of the invention is characterized in that it comprises a support and formed thereover an image-recording layer comprising (A) an infrared absorber, (B) a polymerization initiator, (C) a polymerizable compound, and (D) a binder polymer and capable of being removed with a printing ink or a fountain solution or with both, and that it contains, in the image-recording layer or another layer, a copolymer having at least (a1) repeating units containing at least one ethylenically unsaturated bond and (a2) repeating units containing at least one functional group interacting with the surface of the support (hereinafter, the copolymer is referred to also as "specific copolymer"). The specific copolymer preferably has a hydrophilic segment.

The specific copolymer preferably is one containing repeating units represented by the following formula (I).

$$-(A_1)_x-(A_2)_y- \quad (I)$$

In formula (I), $A_1$ represents a repeating unit containing at least one ethylenically unsaturated bond, and $A_2$ represents a repeating unit containing at least one functional group interacting with the surface of the support. Symbols x and y indicate a copolymerization ratio.

The repeating unit represented by $A_1$ in formula (I) preferably is represented by the following formula (A1).

(A1)

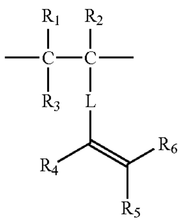

In the formula, $R_1$ to $R_3$ each independently represent a hydrogen atom, an alkyl group having 1 to 6 carbon atoms, or a halogen atom. $R_4$ to $R_6$ each independently represent a hydrogen atom, an alkyl group having 1 to 6 carbon atoms, a halogen atom, an acyl group, or an acyloxy group. $R_5$ may be bonded to $R_4$ or $R_6$ to form a ring. L represents a bivalent connecting group selected from the group consisting of —CO—, —O—, —NH—, bivalent aliphatic groups, bivalent aromatic groups, and combinations of two or more of these.

Examples of L, which consist of such a combination, are shown below. In each of the following examples, the left side bonds to the main chain and the right side bonds to the ethylenically unsaturated bond.

L1: —CO—NH-(bivalent aliphatic group)-O—CO—

L2: —CO-(bivalent aliphatic group)-O—CO—

L3: —CO—O-(bivalent aliphatic group)-O—CO—

L4: -(bivalent aliphatic group)-O—CO—

L5: —CO—NH-(bivalent aromatic group)-O—CO—

L6: —CO-(bivalent aromatic group)-O—CO—

L7: -(bivalent aromatic group)-O—CO—

L8: —CO—O-(bivalent aliphatic group)-CO—O-(bivalent aliphatic group)-O—CO—

L9: —CO—O-(bivalent aliphatic group)-O—CO-(bivalent aliphatic group)-O—CO—

L10: —CO—O-(bivalent aromatic group)-CO—O-(bivalent aliphatic group)-O—CO—

L11: —CO—O-(bivalent aromatic group)-O—CO-(bivalent aliphatic group)-O—CO—

L12: —CO—O-(bivalent aliphatic group)-CO—O-(bivalent aromatic group)-O—CO—

L13: —CO—O-(bivalent aliphatic group)-O—CO-(bivalent aromatic group)-O—CO—

L14: —CO—O-(bivalent aromatic group)-CO—O-(bivalent aromatic group)-O—CO—

L15: —CO—O-(bivalent aromatic group)-O—CO-(bivalent aromatic group)-O—CO—

L16: —CO—O-(bivalent aromatic group)-O—CO—NH—(bivalent aliphatic group)-O—CO—

L17: —CO—O-(bivalent aliphatic group)-O—CO—NH—(bivalent aliphatic group)-O—CO—

The bivalent aliphatic group means an alkylene group, substituted alkylene group, alkenylene group, substituted alkenylene group, alkynylene group, substituted alkynylene group, or polyalkyleneoxy group. Preferred of these are alkylene group, substituted alkylene group, alkenylene group, and substituted alkenylene group. More preferred are alkylene group and substituted alkylene group.

With respect to the structure of the bivalent aliphatic group, a chain structure is preferable to a cyclic structure, and a linear chain structure is preferable to a branched chain structure.

The number of carbon atoms in the bivalent aliphatic group is desirably from 1 to 20, preferably from 1 to 15, more preferably from 1 to 12, even more preferably from 1 to 10, most preferably from 1 to 8.

Examples of substituents of the bivalent aliphatic group include halogen atoms (F, Cl, Br, and I), hydroxyl, carboxyl, amino, cyano, aryl groups, alkoxy groups, aryloxy groups, acyl groups, alkoxycarbonyl groups, aryloxycarbonyl groups, acyloxy groups, monoalkylamino groups, dialkylamino groups, arylamino groups, and diarylamino groups.

The bivalent aromatic group means an arylene group or a substituted arylene group. Preferably, it is phenylene, a substituted phenylene group, naphthylene, or a substituted naphthylene group.

Examples of substituents of the bivalent aromatic group include alkyl group besides the aforementioned examples of substituents of the bivalent aliphatic group.

Preferred of L1 to L17 shown above are L1, L3, L5, L7, and L17.

The repeating unit represented by $A_2$ in formula (I) specifically is represented by the following formula (A2).

(A2)

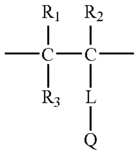

In the formula, $R_1$ to $R_3$ and L have the same meanings as those in the formula (A1). Q represents a functional group interacting with the surface of the support (hereinafter sometimes referred to as "specific functional group").

Examples of the specific functional group include groups capable of undergoing an interaction, such as the formation of a covalent bond, ionic bond, or hydrogen bond, polar interaction, or van der Waals interaction, with a metal, a metal oxide, hydroxyl groups, or the like present on the support which has undergone an anodization treatment or a hydrophilic treatment. Specific examples of the specific functional group are shown below.

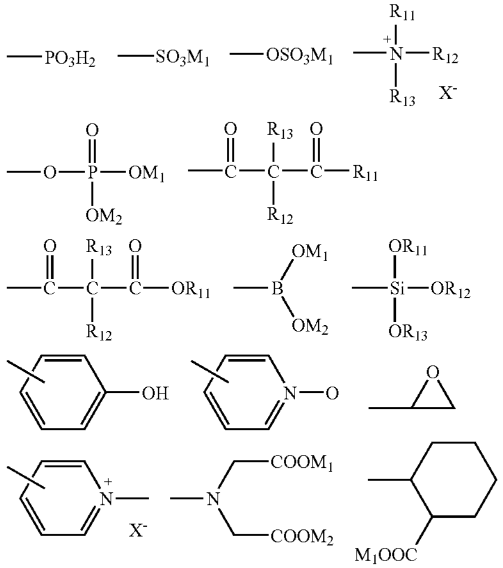

-continued

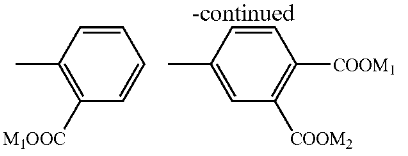

(In the above formulae, $R_{11}$ to $R_{13}$ each independently represent a hydrogen atom, an alkyl group, an aryl group, an alkynyl group, or an alkenyl group; $M_1$ and $M_2$ each independently represent a hydrogen atom, a metal atom, or an ammonium; and $X^-$ represents a counter anion.)

Preferred examples of the specific functional group among those are onium salt groups such as ammonium and pyridinium, phosphate groups, phosphono group, boric acid groups, and β-diketone groups such as an acetylacetone group.

In formula (A2), L represents a bivalent connecting group selected from the group consisting of —CO—, —O—, —NH—, bivalent aliphatic groups, bivalent aromatic groups, and combinations of two or more of these.

Examples of L, which consists of such a combination, include the following besides the examples of the L in the formula (A1) In each of the following examples, the left side bonds to the main chain and the right side bonds to the specific functional group.

L18: —CO—NH—

L19: —CO—O—

L20: -(bivalent aromatic group)-

The repeating unit represented by formula (A2) may have a hydrophilic moiety therein. In the case where formula (A2) does not contain a hydrophilic moiety, it is preferred that the copolymer to be used in the invention should further contain repeating units represented by the following formula (A3) as comonomer units.

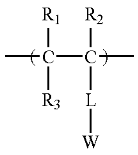

(A3)

In the formula, $R_1$ to $R_3$ and L have the same meanings as those in formula (A1). W represents one of the following groups.

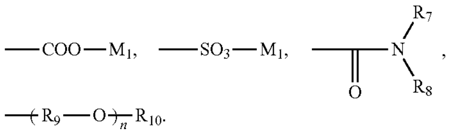

In the formulae, $M_1$ has the same meaning as that described above with regard to formula (A2).

$R_7$ and $R_8$ each independently represent a hydrogen atom or a linear or branched alkyl group having 1 to 6 carbon atoms.

$R_9$ represents a linear or branched alkylene group having 1 to 6 carbon atoms, and preferably is ethylene group.

$R_{10}$ represents a hydrogen atom or an alkyl group having 1 to 12 carbon atoms.

Symbol n represents an integer of 1 to 100, and preferably is 1 to 30.

The repeating unit having at least one hydrophilic group which is represented by (A3) have a logP of preferably from −3 to 3, more preferably from −1 to 2. When the logP thereof is within this range, satisfactory on-press developability is obtained.

The term logP herein means the logarithm of the distribution coefficient of a compound in octanol/water which is calculated with software PC Models, developed by Medicinal Chemistry Project, Pomona College, Claremont, Calif. and available from Daylight Chemical Information System Inc.

W preferably is a group containing an alkyleneoxy group.

The molecular weight of the specific copolymer is in the range of preferably from 500 to 100,000, more preferably from 700 to 50,000, in terms of weight-average molecular weight. The proportion of (a1) is preferably from 5 to 80% by mole, more preferably from 10 to 50% by mole, based on all comonomer units. The proportion of (a2) is preferably from 5 to 80% by mole, more preferably from 10 to 50% by mole, based on all comonomer units. Furthermore, the proportion of (a3) is preferably from 5 to 80% by mole, more preferably from 10 to 50% by mole, based on all comonomer units.

Examples of the specific copolymer to be used in the invention are shown below, but the copolymer should not be construed as being limited to these examples.

1

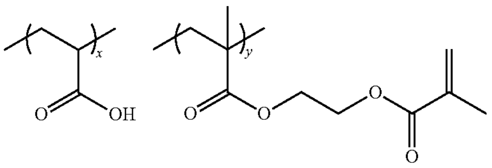

2

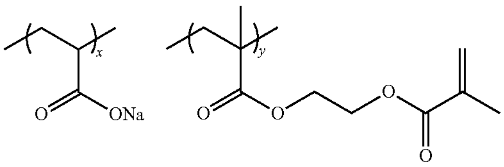

3

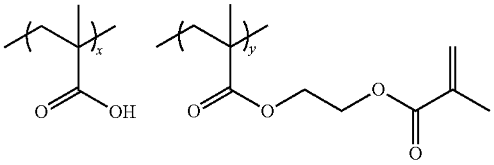

4

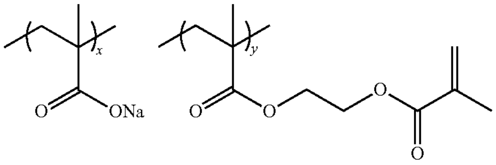

5

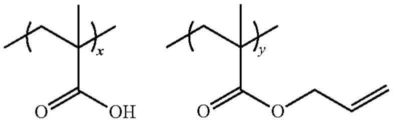

-continued
6
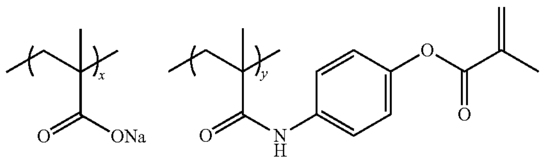
7
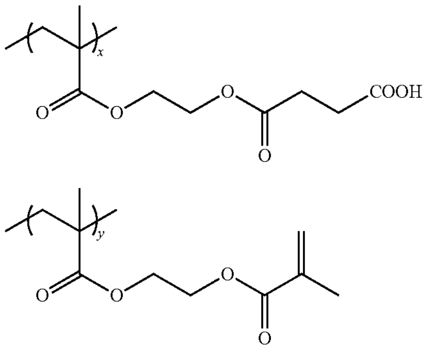
8
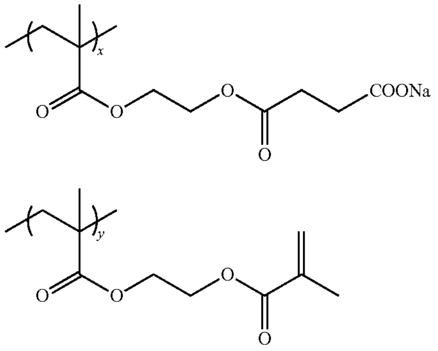
9
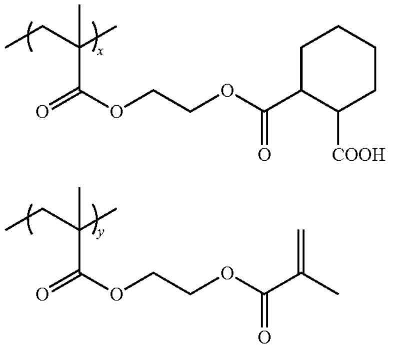
10
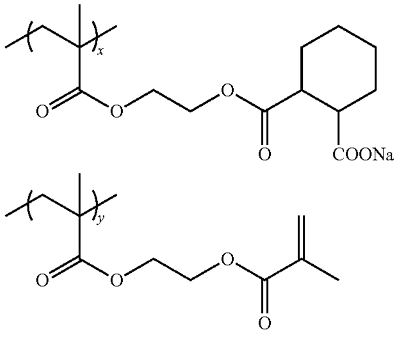
-continued
11
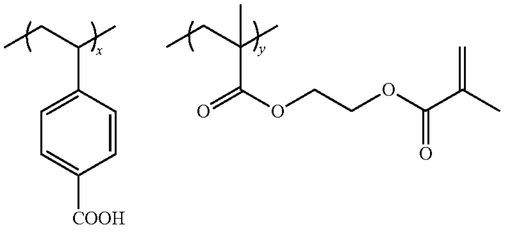
12
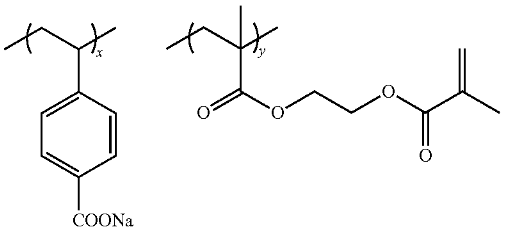
13
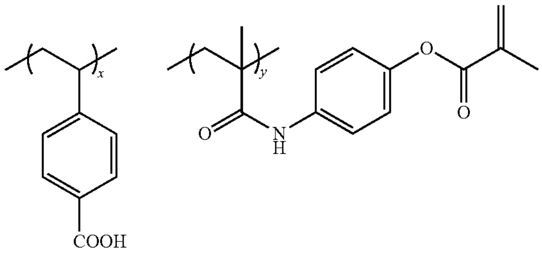
14
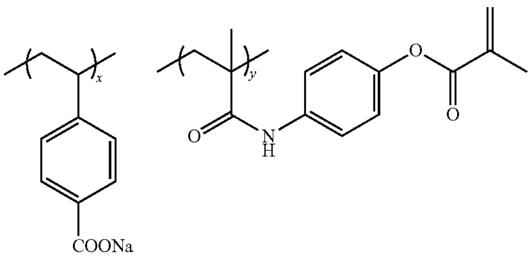
15
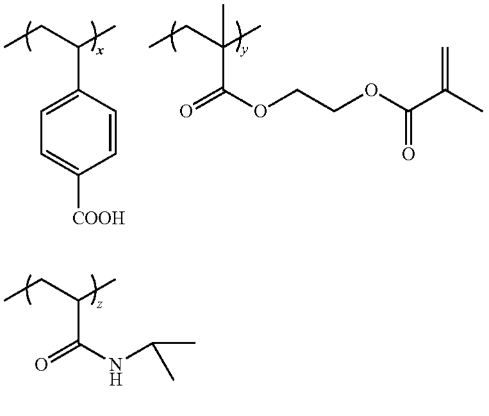

-continued
16
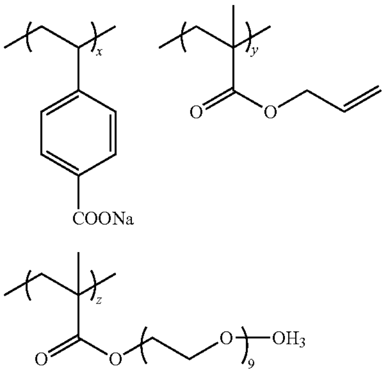
17
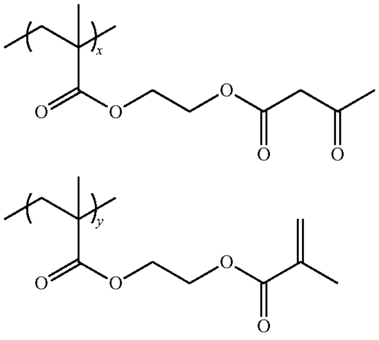
18
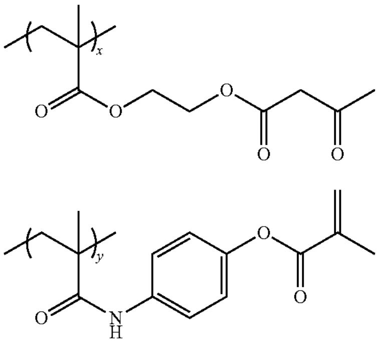
19
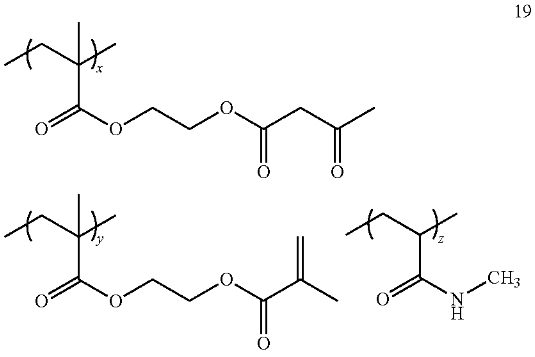
20
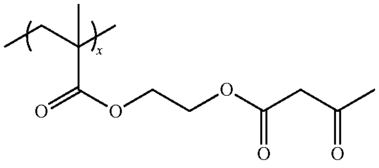
-continued
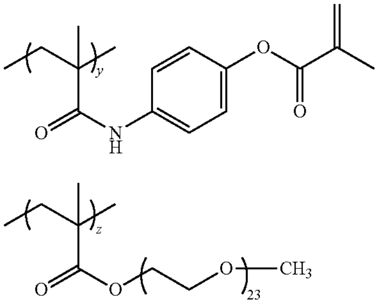
21
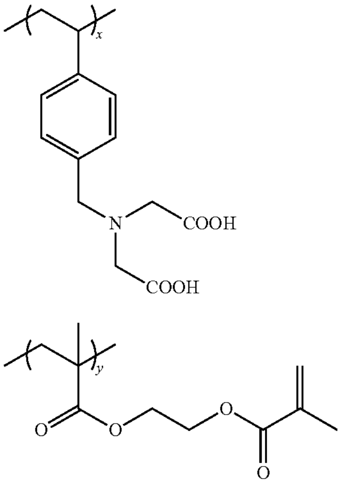
22
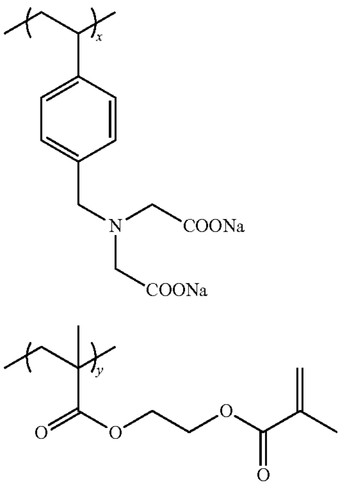
23
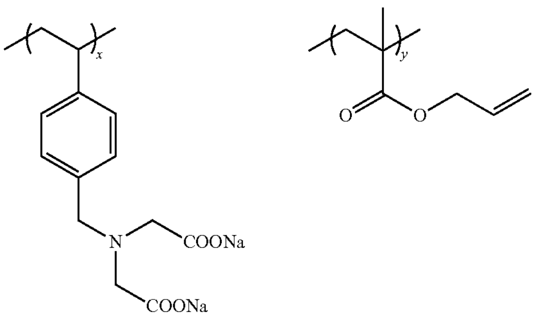

-continued
24
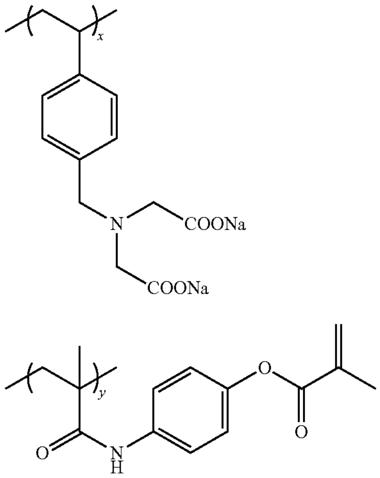
25
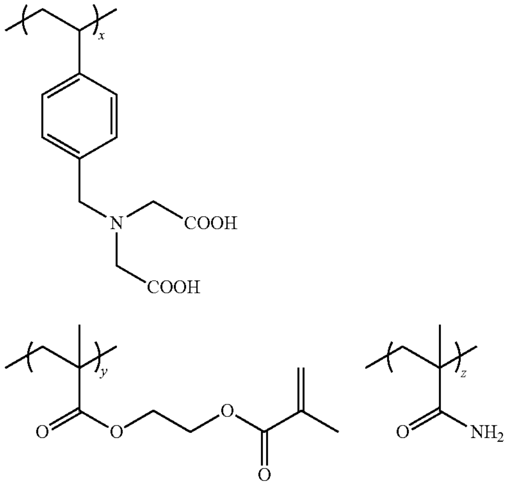
26
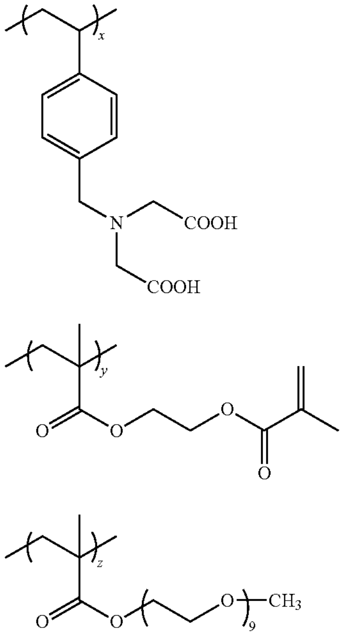
-continued
27
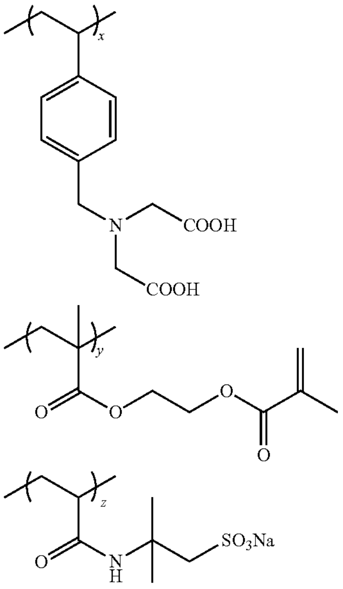
28
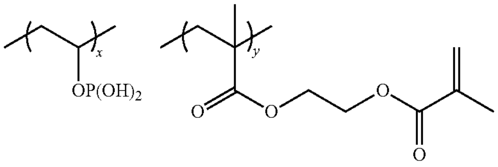
29
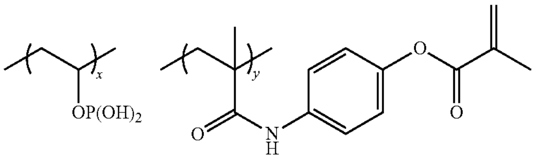
30
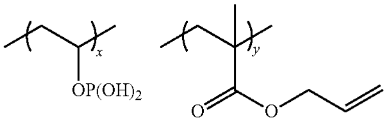
31
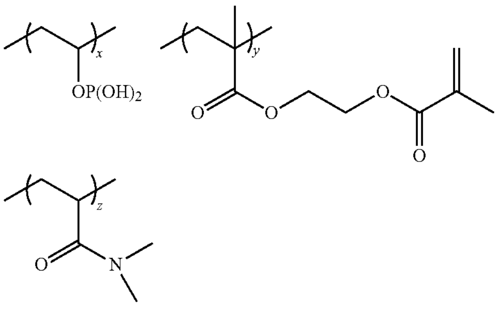
32
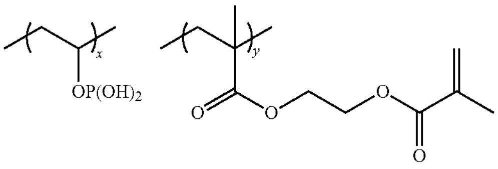

-continued
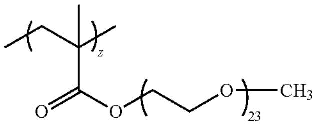
33
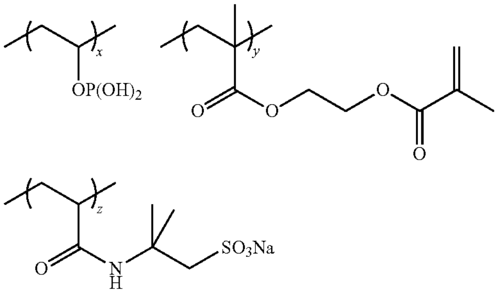
34
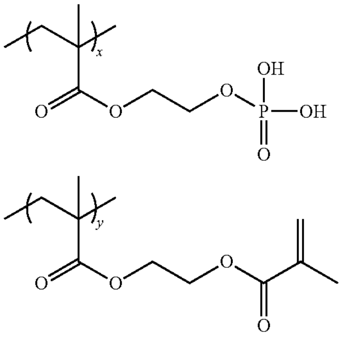
35
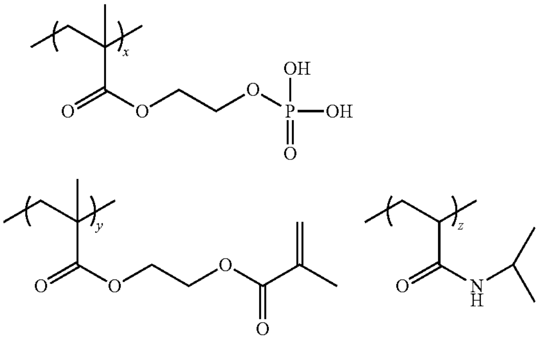
36
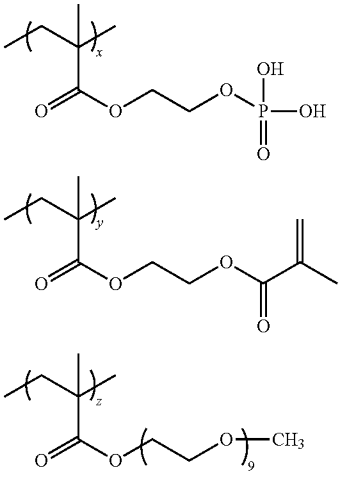
-continued
37
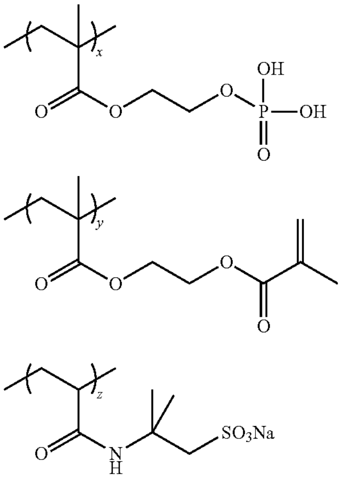
38
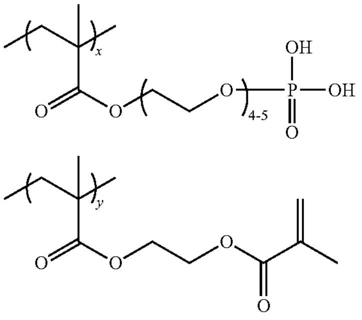
39
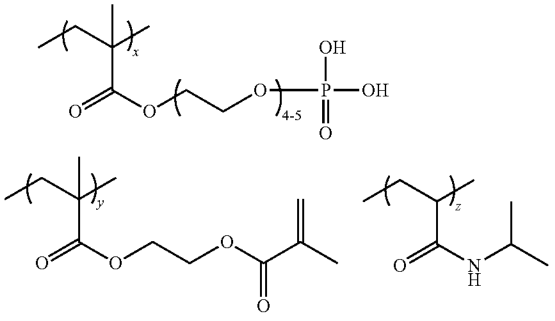
40
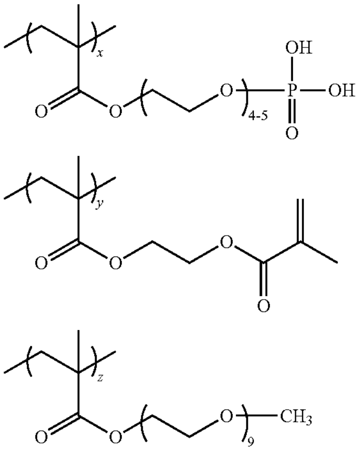

-continued
41
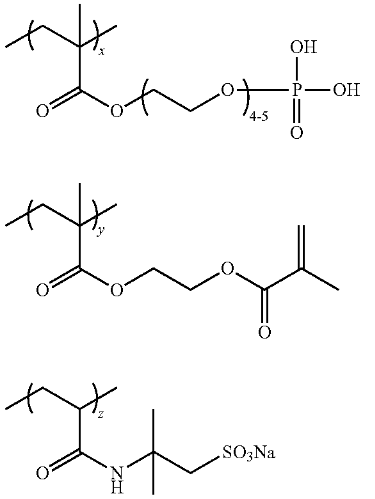
42
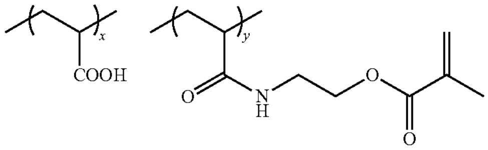
43
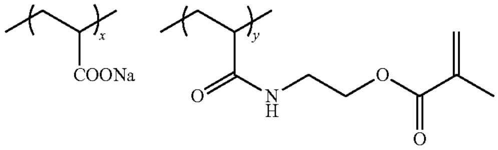
44
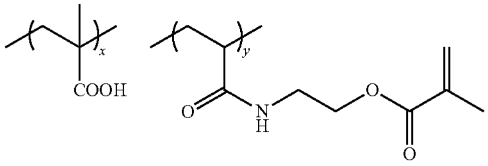
45
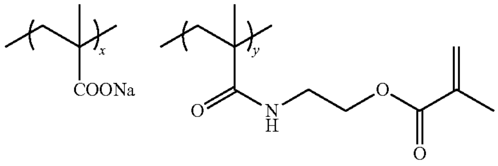
46
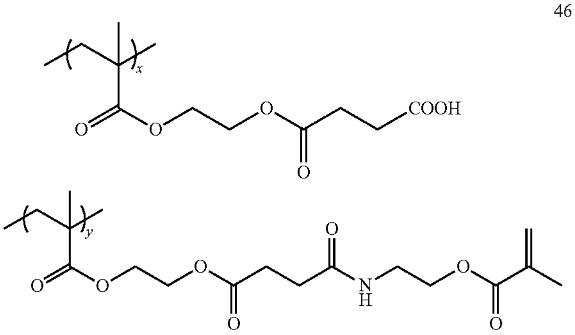
-continued
47
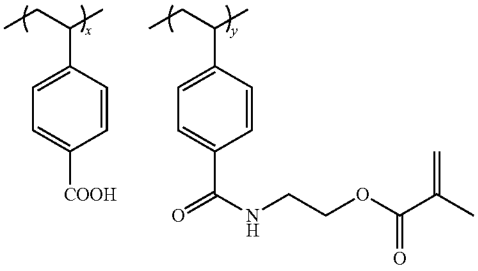
48
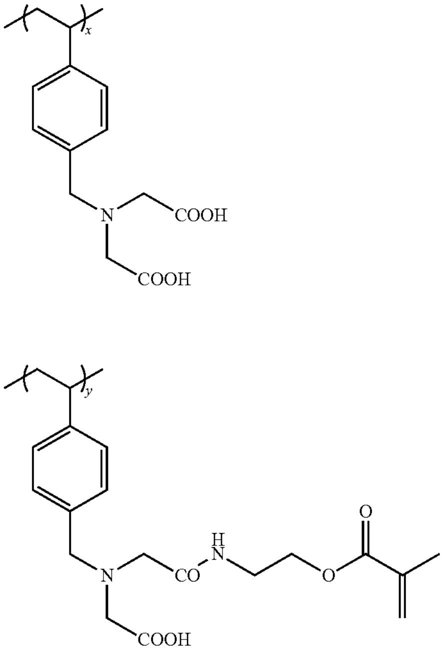
49
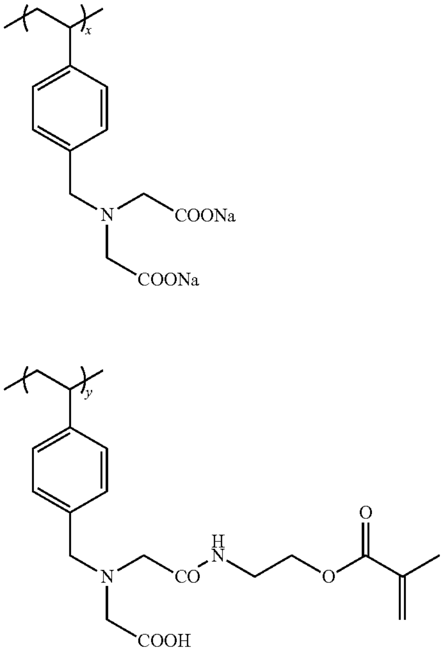

-continued
50
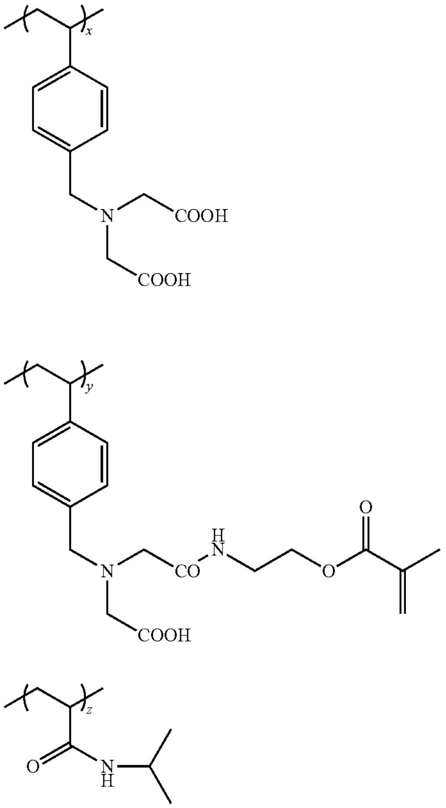
51
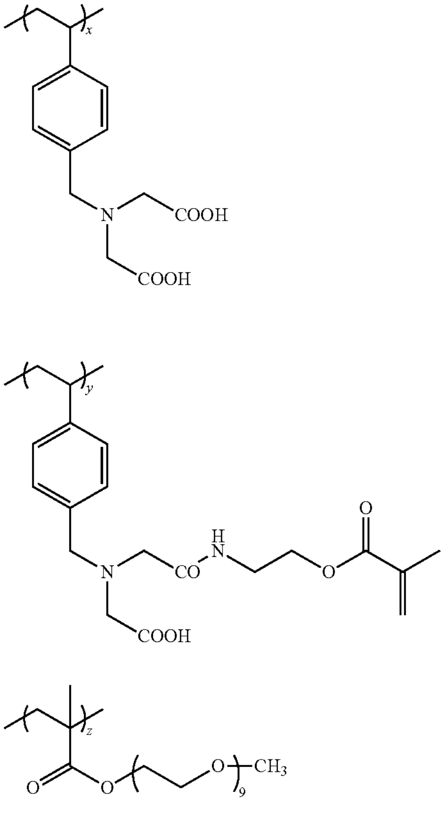
-continued
52
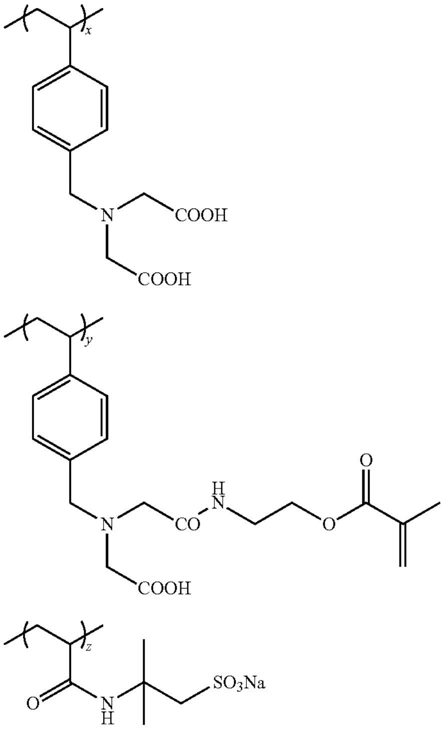
53
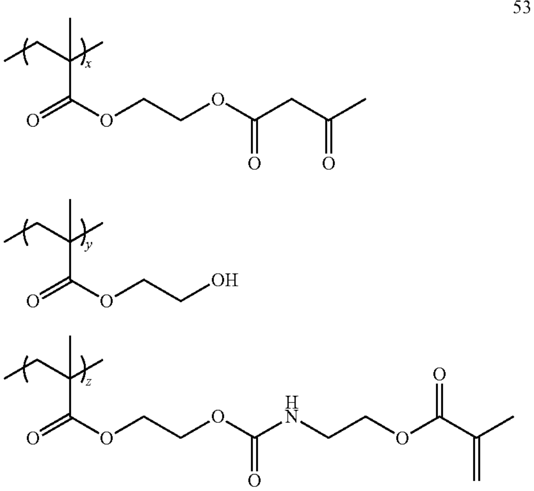
54
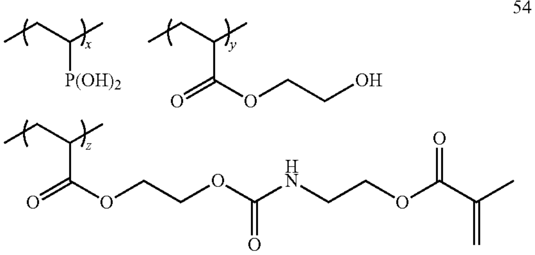
55
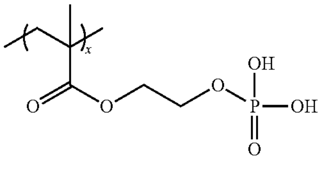

-continued
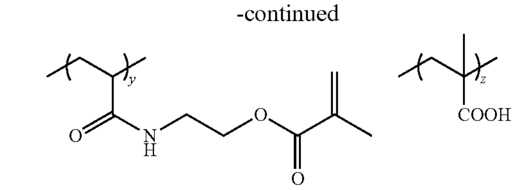
56
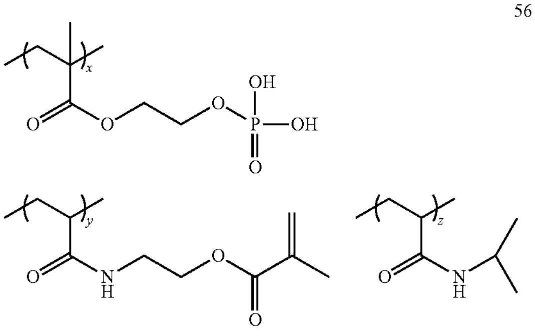
57
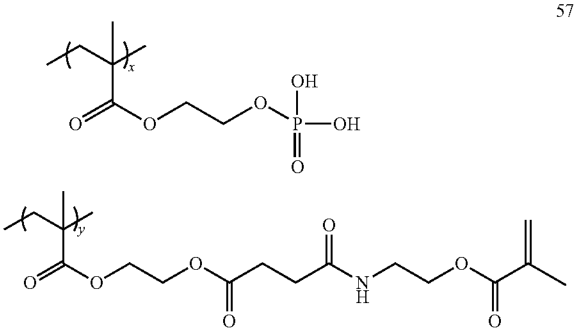
58
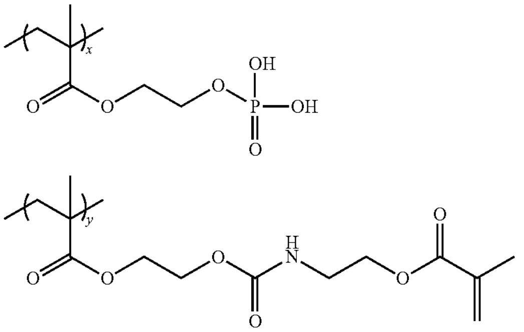
59
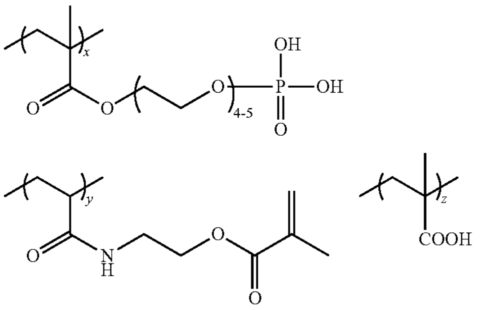
60
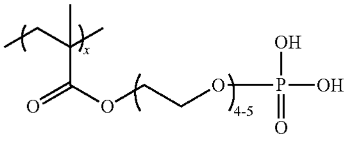
-continued
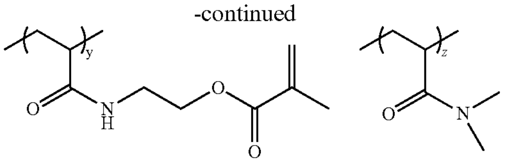
61
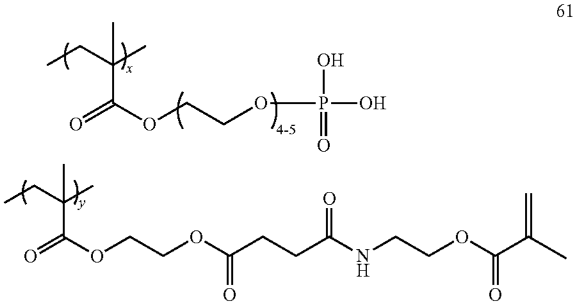
62
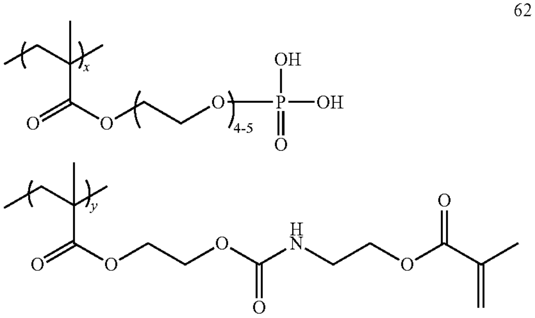
63
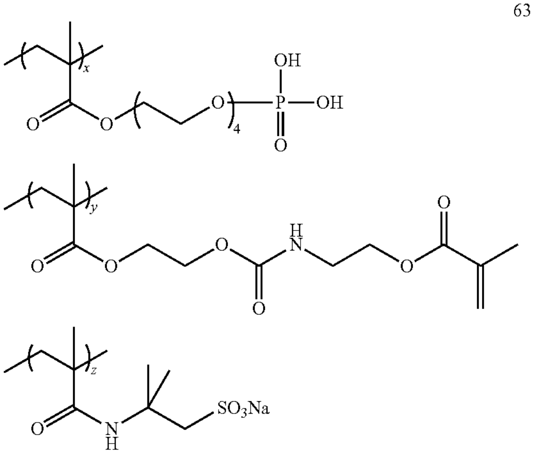
64
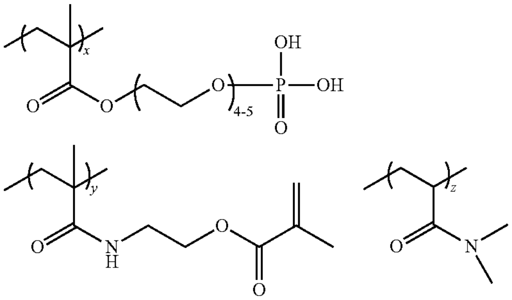
65
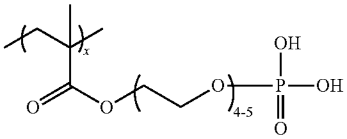

-continued
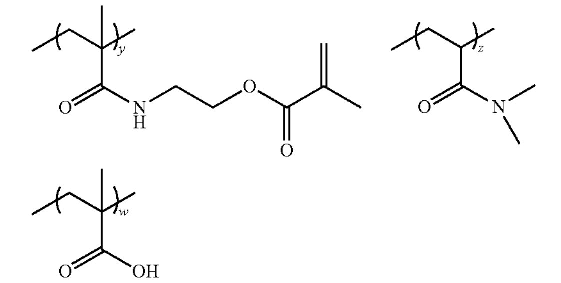
66
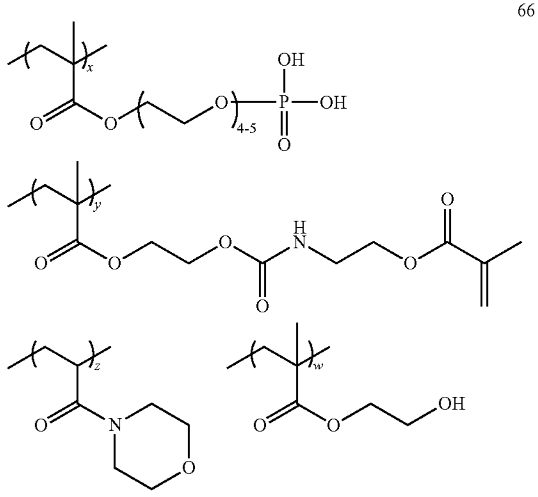
67
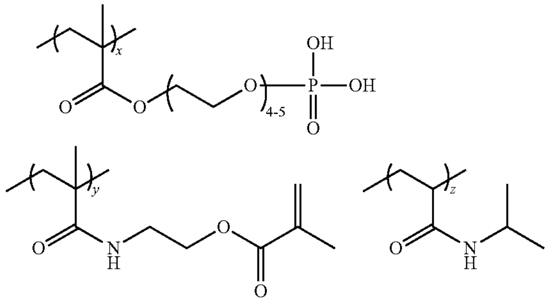
68
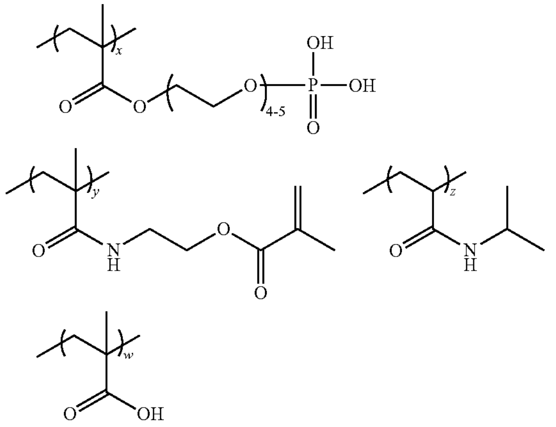
69
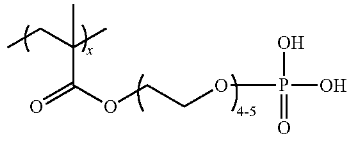
-continued
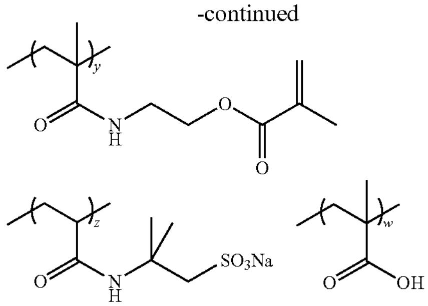
70
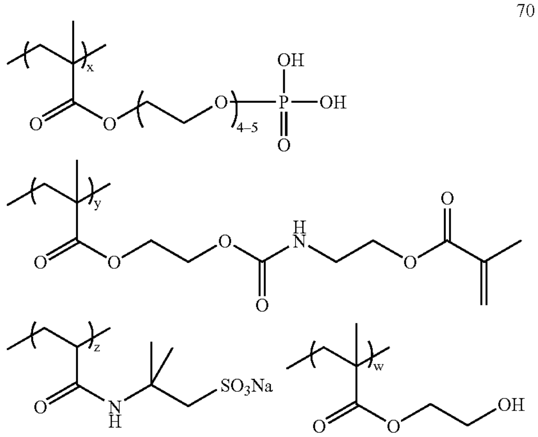
71
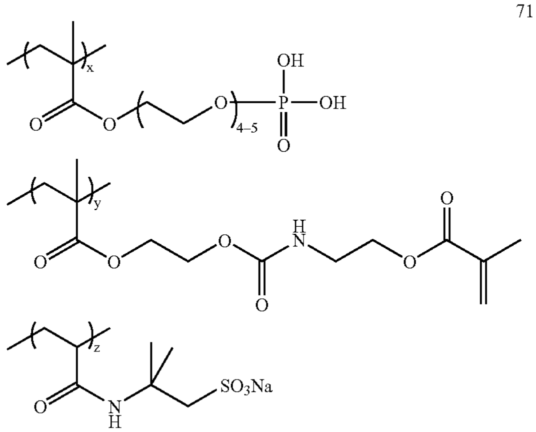
72
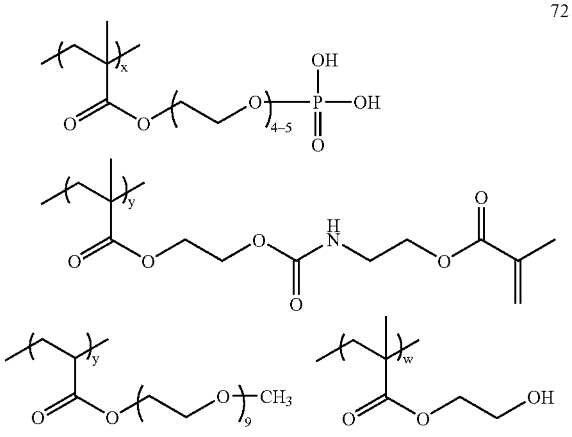
In the invention, the adsorption of the specific copolymer onto an anodized film of an aluminum can be examined by the following method.
The compound to be tested is dissolved in a good solvent therefor to prepare a coating fluid. This coating fluid is applied in an amount of 30 mg/$m^2$ on a dry basis to a support obtained by forming an anodized film on an aluminum, and then dried. The support coated with the test compound is sufficiently rinsed with a good solvent for the compound. Thereafter, the amount of the test compound remaining unremoved after the rinsing is determined to calculate the amount of the compound adsorbed. For this residual-amount determination, the amount of the compound remaining may be directly determined or the amount of the test compound dissolved in the rinse may be determined. The compound amount can be determined by a technique such as, e.g., fluorescent X-ray spectroscopy, spectral reflection/absorbance examination, or liquid chromatography. A compound having the property of being adsorbed onto an anodized film of an aluminum remains in an amount of 0.1 mg/$m^2$ or larger even after such rinsing treatment.

With respect to the manner in which the specific copolymer is used in the invention, it may be incorporated into the image-recording layer or may be incorporated into a layer adjacent to the image-recording layer, such as, e.g., an undercoat layer (interlayer) disposed between the support and the image-recording layer. However, it is especially preferred to use the copolymer in the undercoat layer because this enables the effects of the invention to be sufficiently produced. In this case, there is an advantage that since the undercoat layer functions as a heat-insulating layer, the heat generated by exposure with an infrared laser is prevented from diffusing to the support and is efficiently utilized, whereby enhanced sensitivity can be attained. In addition, this undercoat layer in unexposed areas facilitates the separation of the image-recording layer from the support to thereby improve on-press developability.

In the case where the specific copolymer is used in an undercoat layer in the invention, the copolymer is usually diluted with a solvent before use. Examples of the solvent include water and organic solvents such as methanol, ethanol, propanol, isopropanol, ethylene glycol, hexylene glycol, THF, DMF, 1-methoxy-2-propanol, dimethylacetamide, and dimethyl sulfoxide. Alcohols are especially preferred. These organic solvents may be used as a mixture of two or more thereof.

The concentration of the coating fluid for undercoat formation is preferably from 0.001 to 10% by weight, more preferably from 0.01 to 5% by weight, even more preferably from 0.05 to 1% by weight. One or more of the surfactants which will be described later may be added to the undercoat layer according to need.

The undercoat layer may be formed by coating in an amount (on a dry basis) of preferably from 0.1 to 100 mg/$m^2$, more preferably from 3 to 30 mg/$m^2$.

The image-recording layer in the lithographic printing plate precursor of the invention will be explained next in detail.

The lithographic printing plate precursor of the invention has, formed over the support, an image-recording layer which comprises (A) an infrared absorber, (B) a polymerization initiator, (C) a polymerizable compound, and (D) a binder polymer and which can be removed with a printing ink or a fountain solution or with both.

The ingredients constituting the image-recording layer will be explained below in detail.

[(A) Infrared Absorber]

The image-recording layer in the invention contains an infrared absorber so as to efficiently conduct image formation using a laser, which emits infrared rays of from 760 to 1,200 nm as a light source. An infrared absorber has the function of converting absorbed infrared rays into heat. The polymerization initiator (radical generator), which will be described later, is pyrolyzed by the resultant heat to generate a radical. The infrared absorber to be used in the invention is a dye or pigment having an absorption maximum in the wavelength range of from 760 to 1,200 nm.

As the dye can be used any of commercial dyes and known dyes described in the literature, e.g., Senryô Binran (edited by The Society of Synthetic Organic Chemistry, Japan, published in 1970). Examples thereof include dyes such as azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts, and metal thiolate complexes.

Preferred examples of such dyes include the cyanine dyes shown in, e.g., JP-A-58-125246, JP-A-59-84356, and JP-A-60-78787, the methine dyes shown in, e.g., JP-A-58-173696, JP-A-58-181690, and JP-A-58-194595, the naphthoquinone dyes shown in, e.g., JP-A-58-112793, JP-A-58-224793, JP-A-59-48187, JP-A-59-73996, JP-A-60-52940, and JP-A-60-63744, the squarylium dyes shown in, e.g., JP-A-58-112792, and cyanine dyes shown in British Patent No. 434,875.

The near-infrared-absorbing sensitizer described in U.S. Pat. No. 5,156,938 also is advantageously used. Furthermore, the substituted arylbenzo(thio)pyrylium salts shown in U.S. Pat. No. 3,881,924, the trimethinethiapyrylium salts shown in JP-A-57-142645 (U.S. Pat. No. 4,327,169), the pyrylium compounds shown in JP-A-58-181051, JP-A-58-220143, JP-A-59-41363, JP-A-59-84248, JP-A-59-84249, JP-A-59-146063, and JP-A-59-146061, the cyanine dyes shown in JP-A-59-216146, the pentamethinethiopyrylium salts shown in U.S. Pat. No. 4,283,475, and the pyrylium compounds disclosed in JP-B-5-13514 and JP-B-5-19702 are advantageously used. Other preferred examples of the dye include the near-infrared-absorbing dyes represented by the formulae (I) and (II) shown in U.S. Pat. No. 4,756,993.

Especially preferred of those dyes are cyanine dyes, squarylium dyes, pyrylium salts, nickel thiolate complexes, and indolenine cyanine dyes. More preferred are cyanine dyes and indolenine cyanine dyes. An especially preferred example is a cyanine dye represented by the following general formula (i).

General Formula (i)

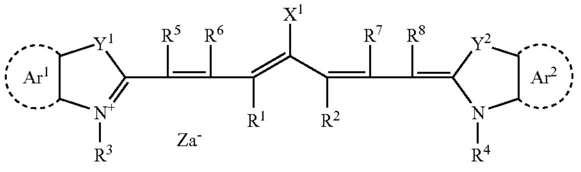

In general formula (i), $X^1$ represents a hydrogen atom, a halogen atom, —$NPh_2$, $X^2$-$L^1$, or the group shown below.

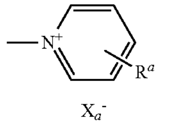

$X^2$ in general formula (i) represents an oxygen atom, a nitrogen atom, or a sulfur atom. $L^1$ represents a hydrocarbon group having 1 to 12 carbon atoms, an aromatic ring having one or more heteroatoms, or a hydrocarbon group having 1 to 12 carbon atoms and containing one or more heteroatoms. The term heteroatoms herein means N, S, O, halogen atoms, and Se. $Xa^-$ has the same meaning as $Za^-$, which will be described later. $R^a$ represents a hydrogen atom or a substituent selected from alkyl groups, aryl groups, a substituted or unsubstituted amino group, and halogen atoms. Ph represents phenyl.

$R^1$ and $R^2$ in general formula (i) each independently represent a hydrocarbon group having 1 to 12 carbon atoms. From the standpoint of the storage stability of a coating fluid for recording layer formation, $R^1$ and $R^2$ preferably are hydrocarbon groups having 2 or more carbon atoms, and especially preferably are bonded to each other to form a 5- or 6-membered ring.

$Ar^1$ and $Ar^2$ may be the same or different and each represent an aromatic hydrocarbon group which may have one or more substituents. Preferred examples of the aromatic hydrocarbon group include a benzene ring and a naphthalene ring. Preferred examples of the substituents include hydrocarbon groups having up to 12 carbon atoms, halogen atoms, and alkoxy groups having up to 12 carbon atoms. $Y^1$ and $Y^2$ may be the same or different and each represent a sulfur atom or a dialkylmethylene group having up to 12 carbon atoms. $R^3$ and $R^4$ may be the same or different and each represent a hydrocarbon group having up to 20 carbon atoms and optionally having one or more substituents. Preferred examples of the substituents include alkoxy groups having up to 12 carbon atoms, carboxyl, and sulfo. $R^5$, $R^6$, $R^7$, and $R^8$ may be the same or different and each represent a hydrogen atom or a hydrocarbon group having up to 12 carbon atoms. From the standpoint of starting-material availability, $R^5$, $R^6$, $R^7$, and $R^8$ preferably are hydrogen atoms. $Za^-$ represents a counter anion, provided that when the cyanine dye represented by general formula (i) has an anionic substituent in its structure and does not necessitate charge neutralization, then $Za^-$ is not necessary. From the standpoint of the storage stability of a coating fluid for recording layer formation, preferred examples of $Za^-$ are halogen ion, perchlorate ion, tetrafluoroborate ion, hexafluorophosphate ion, and sulfonate ion. Especially preferred are perchlorate ion, hexafluorophosphate ion, and arylsulfonate ion.

Examples of the cyanine dye represented by general formula (i), which are suitable for use in the invention, include the cyanine dyes shown in JP-A-2001-133969, paragraphs [0017] to [0019].

Other especially preferred examples thereof include the specific indolenine cyanine dyes shown in JP-A-2002-278057.

As the pigment for use in the invention can be utilized any of commercial pigments and pigments described in *Color Index* (*C.I.*) *Binran, Saishin Ganryô Binran* (edited by Japan Association of Pigment Technology, published in 1977), *Saishin Ganryô Ôyô Gijutsu* (CMC Publishing Co., Ltd. published in 1986), and *Insatsu Inki Gijutsu* (CMC Publishing Co., Ltd. published in 1984).

Examples of the kinds of such pigments include black pigments, yellow-pigments, orange pigments, brown pigments, red pigments, violet pigments, blue pigments, green pigments, fluorescent pigments, metal powder pigments, and polymer-bonded dyes. Specific examples thereof include insoluble azo pigments, azo lake pigments, condensation azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, dyed lake pigments, azine pigments, nitroso pigments, nitro pigments, natural pigments, fluorescent pigments, inorganic pigments, and carbon black. Preferred of these pigments is carbon black.

Those pigments may be used without being surface-treated, or may be used after having undergone a surface treatment. Possible techniques for the surface treatment include a method in which the pigment surface is coated with a resin or wax, a method in which a surfactant is adhered, and a method in which a reactive substance (e.g., a silane coupling agent, epoxy compound, or polyisocyanate) is bonded to the pigment surface. These surface treatment techniques are described in *Kinzoku Sekken No Seishitsu To Ôyô* (Saiwai Shobo), *Insatsu Inki Gijutsu* (CMC Publishing Co., Ltd., published in 1984), and *Saishin Ganryô Ôyô Gijutsu* (CMC Publishing Co., Ltd., published in 1986).

The particle diameter of the pigment is in the range of preferably from 0.01 μm to 10 μm, more preferably from 0.05 μm to 1 μm, especially preferably from 0.1 μm to 1 μm. When the pigment has a particle diameter within this range, a pigment dispersion which is satisfactorily stable in a coating fluid for image-recording layer formation and an image-recording layer having satisfactory evenness are obtained.

For dispersing the pigment, known dispersion techniques for use in ink production, toner production, or the like can be used. Examples of dispersing machines include an ultrasonic disperser, sand mill, attritor, pearl mill, supermill, ball mill, impeller, disperser, KD mill, colloid mill, dynatron, three-roll mill, and pressure kneader. Such dispersion techniques are described in detail in *Saishin Ganryô Ôyô Gijutsu* (CMC Publishing Co., Ltd., published in 1986).

It is preferred that the amount of those infrared absorbers to be added to the image-recording layer should be a minimum necessary amount in order to diminish their side effect of inhibiting polymerization reactions.

Those infrared absorbers can be added in a proportion of from 0.001 to 50% by weight, preferably from 0.005 to 30% by weight, especially preferably from 0.01 to 10% by weight, based on all solid components of the image-recording layer. When the infrared absorber amount is within this range, high sensitivity is obtained without adversely influencing the evenness and film strength of the image-recording layer.

Preferred of the infrared absorbers shown above is the cyanine dye represented by general formula (i).

[(B) Polymerization Initiator]

Polymerization initiators, which can be used in the invention, generate a radical by the action of heat energy or light energy or both and thereby cause the curing reaction of the polymerizable compound, which will be described later, to initiate and proceed. A useful polymerization initiator to be used for this purpose is a thermal decomposition type radical generator, which thermally decomposes to generate a radical. When such a radical generator is used in combination with the infrared absorber described above, the infrared absorber generates heat upon irradiation with infrared laser light and the radical generator generates a radical by the action of the heat. This combination thus enables heat mode recording.

Examples of the radical generator include onium salts, triazine compounds having a trihalomethyl group, peroxides, azo polymerization initiators, azide compounds, and quinone diazide. However, onium salts are preferred because of their high sensitivity. An explanation is given below on onium salts capable of being advantageously used as radical polymerization initiators in the invention. Preferred onium salts include iodonium salts, diazonium salts, and sulfonium salts. In the invention, these onium salts function not as acid generators but as initiators for radical polymerization. Onium salts, which are especially suitable for use in the invention, are represented by the following general formulae (ii) to (iv).

General Formula (ii)

General Formula (iii)

General Formula (iv)

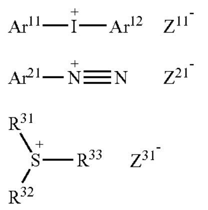

In formula (ii), $Ar^{11}$ and $Ar^{12}$ each independently represent an aryl group having up to 20 carbon atoms and optionally having one or more substituents. When this aryl group has one or more substituents, preferred examples of the substituents include halogen atoms, nitro, alkyl groups having up to 12 carbon atoms, alkoxy groups having up to 12 carbon atoms, and aryloxy groups having up to 12 carbon atoms. $Z^{11-}$ represents a counter ion selected from the group consisting of a halogen ion, perchlorate ion, tetrafluoroborate ion, hexafluorophosphate ion, carboxylate ion, and sulfonate ion. Preferred are a perchlorate ion, hexafluorophosphate ion, carboxylate ion, and arylsulfonate ion.

In formula (iii), $Ar^{21}$ represents an aryl group having up to 20 carbon atoms and optionally having one or more substituents. Preferred examples of the substituents include halogen atoms, nitro, alkyl groups having up to 12 carbon atoms, alkoxy groups having up to 12 carbon atoms, aryloxy groups having up to 12 carbon atoms, alkylamino groups having up to 12 carbon atoms, dialkylamino groups having up to 12 carbon atoms, arylamino groups having up to 12 carbon atoms, and diarylamino groups having up to 12 carbon atoms. $Z^{21-}$ represents a counter ion having the same meaning as $Z^{11-}$.

In formula (iv), $R^{31}$, $R^{32}$, and $R^{33}$ may be the same or different and each represent a hydrocarbon group having up to 20 carbon atoms and optionally having one or more substituents. Preferred examples of the substituents include halogen atoms, nitro, alkyl groups having up to 12 carbon atoms, alkoxy groups having up to 12 carbon atoms, and aryloxy groups having up to 12 carbon atoms. $Z^{31-}$ represents a counter ion having the same meaning as $Z^{11-}$.

Examples of the onium salts suitable for use as radical generators in the invention include the onium salts shown in JP-A-2001-133969, JP-A-2001-343742, and JP-A-2002-148790. Specific examples of the onium salts represented by general formula (ii) ([OI-1] to [OI-10]), onium salts represented by general formula (iii) ([ON-1] to [ON-5]), and onium salts represented by general formula (iv) ([OS-1] to [OS-10]), which are suitable for use in the invention, are shown below. However, the onium salts should not be construed as being limited to these examples.

[OI-1]

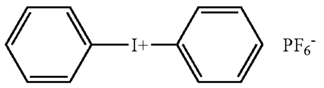

[OI-2]

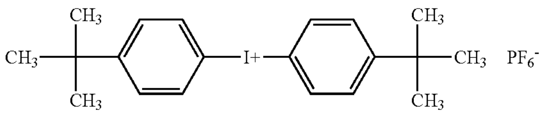

[OI-3]

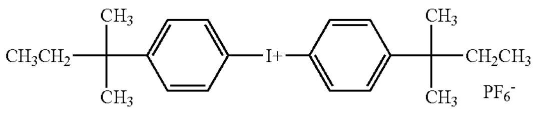

[OI-4]

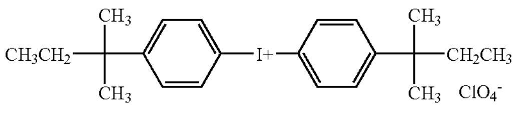

[OI-5]

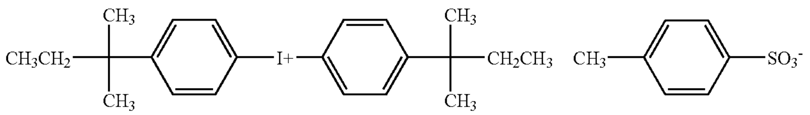

[OI-6]

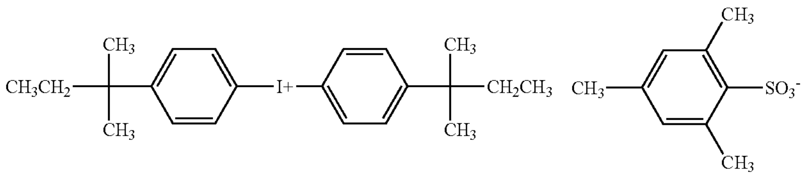

[OI-7]

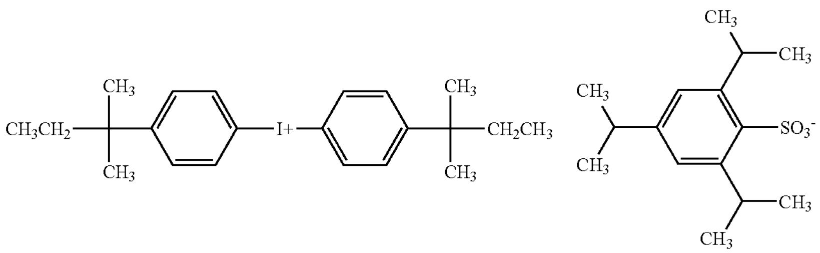

-continued
[OI-8]
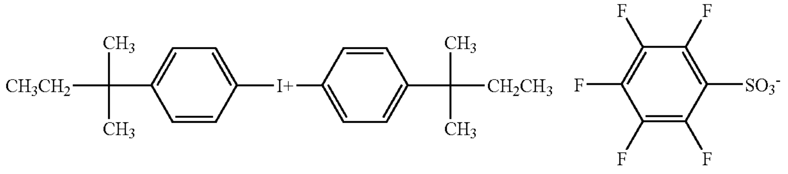
[OI-9]
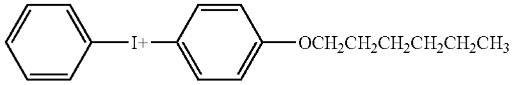
[OI-10]
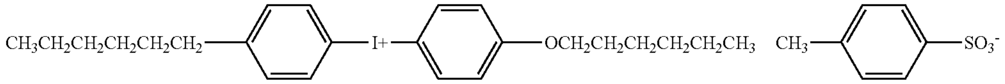
[ON-1]
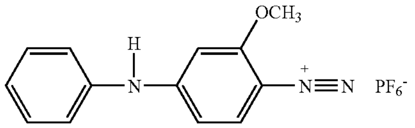
[ON-2]
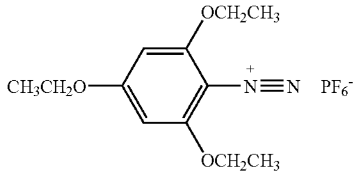
[ON-3]
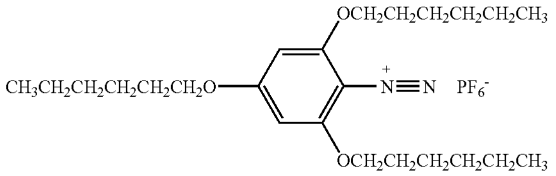
[ON-4]
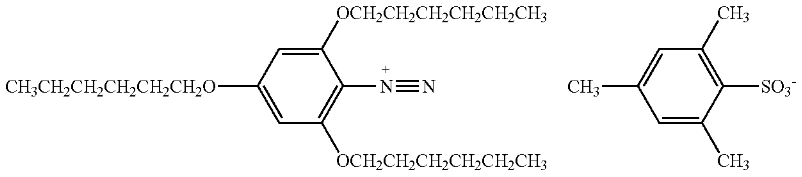
[ON-5]
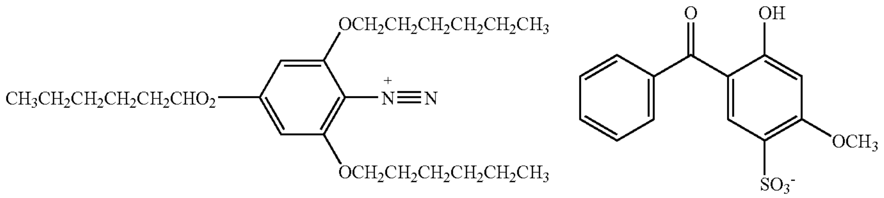
[OS-1]
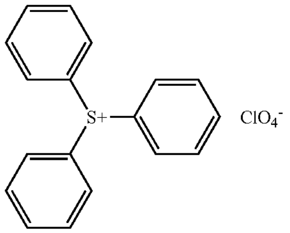
[OS-2]
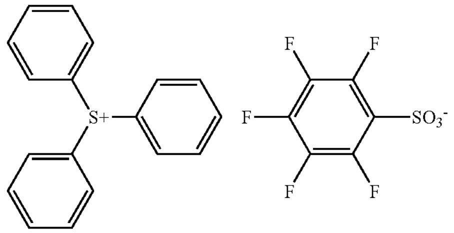
[OS-3]
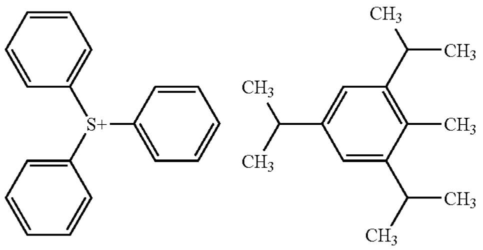
[OS-4]
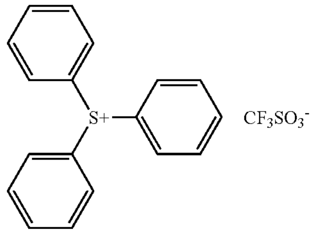

-continued

[OS-5]

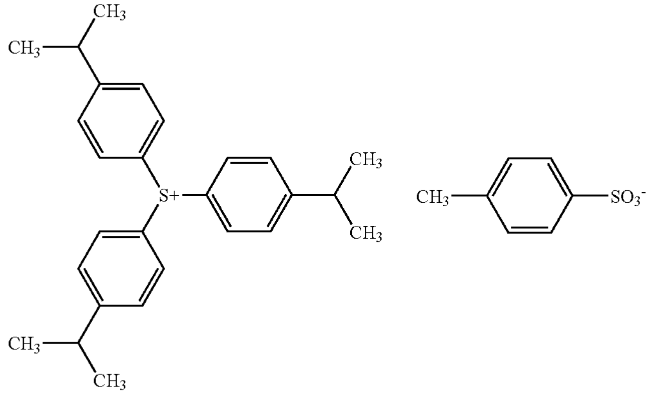

[OS-6]

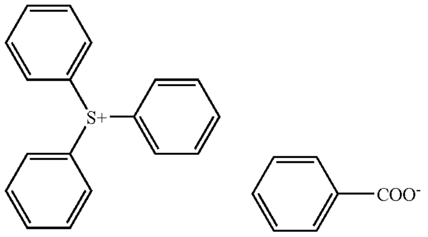

[OS-7]

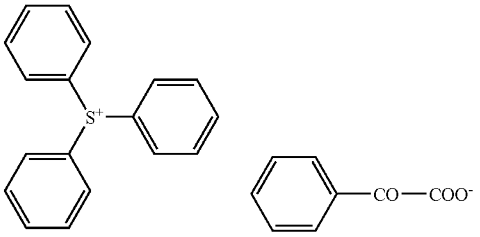

[OS-8]

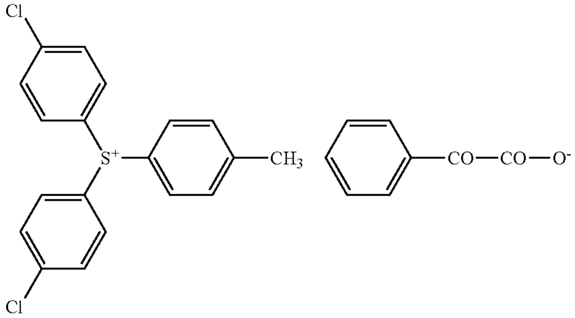

[OS-9]

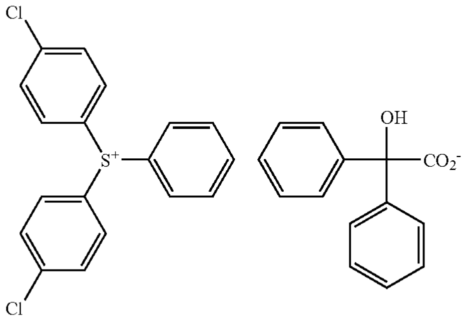

[OS-10]

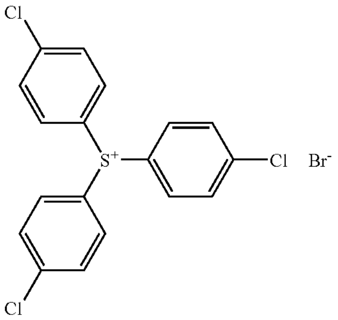

The radical generator to be used in the invention preferably has an absorption-maximum wavelength of 400 nm or shorter. The absorption-maximum wavelength therefor is more preferably 360 nm or shorter, most preferably 300 nm or shorter. By using such a radical generator having absorption wavelengths in the ultraviolet region, the lithographic printing plate precursor can be handled in white light.

Those polymerization initiators can be added in a proportion of from 0.1 to 50% by weight, preferably from 0.5 to 30% by weight, especially preferably from 1 to 20% by weight, based on all solid ingredients constituting the image-recording layer. When the polymerization initiator amount is within this range, satisfactory sensitivity is obtained and the nonimage areas have satisfactory unsusceptibility to scumming during printing. Those polymerization initiators may be used alone or in combination of two or more thereof. Any of those polymerization initiators and other ingredients may be added to the same layer. Alternatively, a layer containing any of the polymerization initiators may be separately formed.

[(C) Polymerizable Compound]

The polymerizable compound to be used in the image-recording layer in the invention is an addition-polymerizable compound having at least one ethylenically unsaturated double bond. It is selected from compounds having at least one, preferably two or more ethylenically unsaturated terminal bonds. Such compounds are well known in this industrial field, and can be used in the invention without particular limitations. These are in chemical forms such as, e.g., a monomer, a prepolymer, i.e., dimer, trimer, or oligomer, a mixture of two or more of these, and a copolymer of two or more of these. Examples of the monomer and copolymers thereof include unsaturated carboxylic acids (e.g., acrylic acid, methacrylic acid, itaconic acid, crotonic acid, isocrotonic acid, and maleic acid) and esters and amides of these. Preferably, an ester of an unsaturated carboxylic acid with an aliphatic polyhydric alcohol compound or an amide of an unsaturated carboxylic acid with an aliphatic polyamine compound is used. Also preferably used are: a product of the addition reaction of an unsaturated carboxylic acid ester or amide having a nucleophilic substituent, such as hydroxyl, amino, or mercapto, with a mono- or polyfunctional isocyanate or epoxy; a product of a dehydrating condensation reaction with a mono- or polyfunctional carboxylic acid; and the like. Furthermore, a product of the addition reaction of an unsaturated carboxylic acid ester or amide having an electrophilic substituent, such as an isocyanate group or epoxy group, with a mono- or polyfunctional alcohol, amine, or thiol and a product of the substitution reaction of an unsaturated carboxylic acid ester or amide having an eliminable substituent, such as a halogen group or tosyloxy, with a mono- or polyfunctional alcohol, amine, or thiol are also preferred. Other usable examples include compounds obtained through these reactions using an unsaturated phosphonic acid, styrene, vinyl ether, or the like in place of the unsaturated carboxylic acid.

Examples of the monomeric ester of an aliphatic polyhydric alcohol compound with an unsaturated carboxylic acid include acrylic esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, isocyanuric acid ethylene oxide (EO)-modified triacrylate, and polyester acrylate oligomers.

Examples of methacrylic esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane.

Examples of itaconic esters include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. Examples of crotonic esters include ethylene glycol dicrotonate, tetramethylene glycol dicrotonate, pentaerythritol dicrotonate, and sorbitol tetradicrotonate. Examples of isocrotonic esters include ethylene glycol diisocrotonate, pentaerythritol diisocrotonate, and sorbitol tetraisocrotonate. Examples of maleic esters include ethylene glycol dimaleate, triethylene glycol dimaleate, pentaerythritol dimaleate, and sorbitol tetramaleate.

Examples of other preferred esters include the aliphatic alcohol esters described in JP-B-51-47334 and JP-A-57-196231, the esters having an aromatic framework which are described in JP-A-59-5240, JP-A-59-5241, and JP-A-2-226149, and the esters having an amino group which are described in JP-A-1-165613. The ester monomers mentioned above can be used also as a mixture of two or more thereof.

Examples of the monomeric amide of an aliphatic polyamine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide, and xylylenebismethacrylamide. Other preferred examples of the amide monomer include the amides having a cyclohexylene structure which are described in JP-B-54-21726.

An addition-polymerizable urethane compound produced by the addition reaction of an isocyanate with hydroxyl groups is also preferred. Examples of this compound include the vinyl urethane compounds having two or more polymerizable vinyl groups per molecule which are described in JP-B-48-41708. These vinyl urethane compounds are obtained by causing a hydroxyl-containing vinyl monomer represented by the following general formula (A) to add to a polyisocyanate compound having two or more isocyanate groups per molecule.

$$CH_2{=}C(R_4)\,COOCH_2CH(R_5)OH \qquad (A)$$

(In formula (A), $R_4$ and $R_5$ each represent H or $CH_3$.)

Furthermore, the urethane acrylates described in JP-A-51-37193, JP-B-2-32293, and JP-B-2-16765 and the urethane compounds having an ethylene oxide-based backbone which are described in JP-B-58-49860, JP-B-56-17654, JP-B-62-39417, and JP-B-62-39418 are also preferred. In addition, when any of the addition-polymerizable compounds having an amino structure or sulfide structure in the molecule which are described in JP-A-63-277653, JP-A-63-260909, and JP-A-1-105238 is used, a photopolymerizable composition having exceedingly high photosensitivity can be obtained.

Other examples of the polymerizable compound include polyfunctional acrylates or methacrylates, such as the polyester acrylates described in JP-A-48-64183, JP-B-49-43191, and JP-B-52-30490 and epoxy acrylates obtained by reacting an epoxy resin with (meth)acrylic acid. Examples thereof further include the specific unsaturated compounds described in JP-B-46-43946, JP-B-1-40337, and JP-B-1-40336 and the vinylphosphonic acid compound described in JP-A-2-25493. In some cases, the perfluoroalkyl-containing structure described in JP-A-61-22048 is advantageously used. Furthermore, the photocurable monomers and oligomers shown in *Nihon Setchaku Kyôkai-shi*, Vol.20, No.7, pp.300-308 (1984) can be used.

Details of the structures of those polymerizable compounds and of methods of using these, e.g., as to whether the compounds are used alone or in combination and the amount of the compounds to be added, can be determined at will according to the performance design of the final lithographic printing plate precursor. For example, selections are made from the following standpoints.

From the standpoint of sensitivity, a structure having a larger amount of unsaturated bonds per molecule is preferred. In many cases, a structure having a functionality of 2 or higher is preferred. From the standpoint of enhancing the strength of image areas, i.e., cured film, a structure having a functionality of 3 or higher is preferred. To use a combination of compounds having different functionalities or different polymerizable groups (e.g., an acrylic ester, methacrylic ester, styrene compound, and vinyl ester compound) is an effective method for regulating both sensitivity and strength.

Furthermore, a selection of polymerizable compounds and methods of using these are important factors which influence compatibility with and dispersibility in other ingredients in the image-recording layer (e.g., the binder polymer, polymerization initiator, colorant, etc.). For example, there are cases where use of a low-impurity compound or use of a combination of two or more compounds can improve compatibility. There also are cases where a specific structure is selected for the purpose of improving adhesion to the support or to the overcoat layer which will be described later, etc.

Those polymerizable compounds are used in an amount in the range of preferably from 5 to 80% by weight, more preferably from 25 to 75% by weight, based on all solid components of the image-recoding layer. Those compounds may be used alone or in combination of two or more thereof. In addition, with respect to methods of using polymerizable compounds, it is possible to freely select appropriate structures, proportions, and addition amounts from the standpoints of the degree of polymerization inhibition by oxygen, resolution, susceptibility to fogging, refractive index change, surface tackiness, etc. In some cases, a layer constitution/coating method including undercoating and overcoating is possible.

[(D) Binder Polymer]

A binder polymer is used as an essential ingredient in the invention in order to improve the film properties and on-press developability of the image-recording layer. Any of known binder polymers can be used without limitations. Linear organic polymers having film-forming properties are preferred. Examples of such binder polymers include acrylic resins, poly(vinyl acetal) resins, polyurethane resins, polyurea resins, polyimide resins, polyamide resins, epoxy resins, methacrylic resins, polystyrene resins, novolac type phenolic resins, polyester resins, synthetic rubbers, and natural rubber.

The binder polymer preferably has crosslinkability so as to improve the film strength of image areas. A binder polymer having crosslinkability can be obtained by incorporating crosslinkable functional groups such as, e.g., ethylenically unsaturated bonds into the main chain or side chains of a polymer. The crosslinkable functional groups may be incorporated by copolymerization or by a polymer reaction.

Examples of polymers having ethylenically unsaturated bonds in the main chain of the molecule include poly(1,4-butadiene) and poly(1,4-isoprene).

Examples of polymers having ethylenically unsaturated bonds in side chains of the molecule include polymers of esters or amides of acrylic or methacrylic acid, in which at least part of the ester or amide residues (i.e., R in either —COOR or CONHR) have an ethylenically unsaturated bond.

Examples of the residues (the R) having an ethylenically unsaturated bond include $-(CH_2)_nCR^1{=}CR^2R^3$, $-(CH_2O)_nCH_2CR^1{=}CR^2R^3$, $-(CH_2CH_2O)_nCH_2CR^1{=}CR^2R^3$, $-(CH_2)_nNH-CO-O-CH_2CR^1{=}CR^2R^3$, $-(CH_2)_n-O-CO-CR^1{=}CR^2R^3$, and $(CH_2CH_2O)_2-X$ (wherein $R^1$ to $R^3$ each represent a hydrogen atom, a halogen atom, or an alkyl, aryl, alkoxy, or aryloxy group having 1 to 20 carbon atoms, provided that $R^1$ may be bonded to $R^2$ or $R^3$ to form a ring; n represents an integer of 1 to 10; and X represents a dicyclopentadienyl residue).

Examples of the ester residues include $-CH_2CH{=}CH_2$, $-CH_2CH_2O-CH_2CH{=}CH_2$, $-CH_2C(CH_3){=}CH_2$, $-CH_2CH{=}CH-C_6H_5$, $-CH_2CH_2OCOCH{=}CH-C_6H_5$, $-CH_2CH_2OCOC(CH_3){=}CH_2$, $-CH_2CH_2OCOCH{=}CH_2$, $-CH_2CH_2-NHCOO-CH_2CH{=}CH_2$, and $CH_2CH_2O-X$ (wherein X represents a dicyclopentadienyl residue).

Examples of the amide residues include $-CH_2CH{=}CH_2$, $-CH_2CH_2-Y$ (wherein Y represents a cyclohexene residue), and $-CH_2CH_2-OCO-CH{=}CH_2$.

A binder polymer having crosslinkability cures, for example, by the following mechanism. Free radicals (polymerization initiator radicals or growth radicals which are radicals of a polymerizable compound which is polymerizing) add to crosslinkable functional groups of the binder polymer to cause addition polymerization directly between polymer molecules or through polymeric chains of the polymerizable compound. As a result, crosslinks are formed between polymer molecules, whereby the binder polymer cures. Alternatively, atoms in the polymer (e.g., hydrogen atoms bonded to the carbon atoms adjacent to the functional crosslinkable groups) are withdrawn by free radicals to yield polymer radicals, and these polymer radicals bond to one another to form crosslinks between polymer molecules, whereby the binder polymer cures.

The content of crosslinkable groups in the binder polymer (content of radical-polymerizable unsaturated double bonds as determined by iodometric titration) is preferably from 0.1 to 10.0 mmol, more preferably from 1.0 to 7.0 mmol, most preferably from 2.0 to 5.5 mmol, per g of the binder polymer. When the content of crosslinkable groups is within this range, satisfactory sensitivity and satisfactory storage stability are obtained.

From the standpoint of improving the removability of unexposed areas of the image-recording layer in on-press development, the binder polymer preferably has high solubility or dispersibility in inks and/or a fountain solution.

In order for a binder polymer to have improved solubility or dispersibility in inks, it desirably is ink-receptivity. In order for a binder polymer to have improved solubility or dispersibility in a fountain solution, it desirably is hydrophilic. Because of this, it is also effective in the invention to use an ink-receptivity binder polymer and a hydrophilic binder polymer in combination.

Preferred examples of the hydrophilic binder polymer include binder polymers having hydrophilic groups such as hydroxy, carboxyl, carboxylate, hydroxyethyl, polyoxyethyl, hydroxypropyl, polyoxypropyl, amino, aminoethyl, aminopropyl, ammonium, amide, carboxymethyl, sulfo, or phosphate groups.

Specific examples thereof include gum arabic, casein, gelatin, starch derivatives, carboxymethyl cellulose and the sodium salt thereof, cellulose acetate, sodium alginate, vinyl acetate/maleic acid copolymers, styrene/maleic acid copolymers, poly(acrylic acid)s and salts thereof, poly(methacrylic acid)s and salts thereof, homopolymer and copolymers of hydroxyethyl methacrylate, homopolymer and copolymers of hydroxyethyl acrylate, homopolymer and copolymers of hydroxypropyl methacrylate, homopolymer and copolymers of hydroxypropyl acrylate, homopolymer and copolymers of hydroxybutyl methacrylate, homopolymer and copolymers of hydroxybutyl acrylate, polyethylene glycols, hydroxypropylene polymers, poly(vinyl alcohol)s, hydrolyzed poly(vinyl acetate) having a degree of hydrolysis of 60% by weight or higher, preferably 80% by weight or higher, poly(vinyl formal), poly(vinyl butyral), polyvinylpyrrolidone, homopolymer and copolymers of acrylamide, homopolymer and copolymers of methacrylamide, homopolymer and copolymers of polyvinylpyrrolidone, N-methylolacrylamide, alcohol-soluble nylons, and polyethers of 2,2-bis(4-hydroxyphenyl)propane with epichlorohydrin.

The binder polymer has a weight-average molecular weight of preferably 5,000 or higher, more preferably from 10,000 to 300,000, and a number-average molecular weight of preferably 1,000 or higher, more preferably from 2,000 to 250,000. The polydispersity coefficient (weight-average molecular weight/number-average molecular weight) thereof is preferably from 1.1 to 10.

The binder polymer may be any of a random polymer, block polymer, graft polymer, and the like. However, it preferably is a random polymer.

Such binder polymers can be synthesized by known methods. A binder polymer having crosslinkable groups in side chains can be easily synthesized by radical polymerization or a polymer reaction.

Binder polymers may be used alone or as a mixture of two or more thereof.

The content of the binder polymer is preferably from 10 to 90% by weight, more preferably from 20 to 80% by weight, based on all solid components of the image-recording layer. When the binder polymer content is within this range, satisfactory image-area strength and image-forming properties are obtained.

It is preferred that the polymerizable compound and the binder polymer be used in a proportion of from 1/9 to 7/3 in terms of weight ratio.

[Other Components of Image-Recording Layer]

Besides ingredients (A) to (D) described above, other ingredients can be incorporated into the image-recording layer in the invention. Examples thereof include a surfactant, colorant, printing-out agent, polymerization inhibitor (heat polymerization inhibitor), higher fatty acid derivative, plasticizer, fine inorganic particles, and low-molecular hydrophilic compound.

<Surfactant>

A surfactant is preferably used for the image-recording layer in the invention in order to enhance on-press developability in printing initiation and to improve the state of coating surface. Examples of the surfactant include nonionic surfactants, anionic surfactants, cationic surfactants, amphoteric surfactants, and fluorochemical surfactants. Such surfactants may be used alone or in combination of two or more thereof.

The nonionic surfactants for use in the invention are not particularly limited, and known ones can be used. Examples thereof include polyoxyethylene alkyl ethers, polyoxyethylene alkylphenyl ethers, polyoxyethylene polystyrylphenyl ethers, polyoxyethylene-polyoxypropylene alkyl ethers, partial fatty acid esters of glycerol, partial fatty acid esters of sorbitan, partial fatty acid esters of pentaerythritol, monoesters of fatty acids with propylene glycol, partial fatty acid esters of sucrose, partial fatty acid esters of polyoxyethylene-sorbitan, partial fatty acid esters of polyoxyethylene-sorbitol, polyethylene glycol fatty acid esters, partial fatty acid esters of polyglycerol, polyoxyethylene castor oils, partial fatty acid esters of polyoxyethylene-glycerol, fatty acid diethanolamides, N,N-bis-2-hydroxyalkylamines, polyoxyethylene alkylamines, triethanolamine fatty acid esters, trialkylamine oxides, polyethylene glycol, and copolymers of polyethylene glycol and polypropylene glycol.

The anionic surfactants for use in the invention are not particularly limited, and known ones can be used. Examples thereof include fatty acid salts, abietic acid salts, hydroxyalkanesulfonic acid salts, alkanesulfonic acid salts, dialkyl sulfosuccinate salts, linear alkylbenzenesulfonic acid salts, branched alkylbenzenesulfonic acid salts, alkylnaphthalenesulfonic acid salts, alkylphenoxypolyoxyethylenepropylsulfonic acid salts, polyoxyethylene alkylsulfophenyl ether salts, N-methyl-N-oleyltaurine sodium salt, N-alkylsulfosuccinic acid monoamide disodium salts, petroleumsulfonic acid salts, sulfonated beef tallow oil, sulfuric acid ester salts of fatty acid alkyl esters, alkylsulfuric acid ester salts, polyoxyethylene alkyl ether sulfuric acid ester salts, fatty acid monoglyceride sulfuric acid ester salts, polyoxyethylene alkylphenyl ether sulfuric acid ester salts, polyoxyethylene styrylphenyl ether sulfuric acid ester salts, alkylphosphoric acid ester salts, polyoxyethylene alkyl ether phosphoric acid ester salts, polyoxyethylene alkylphenyl ether phosphoric acid ester salts, partially saponified styrene/maleic anhydride copolymers, partially saponified olefin/maleic anhydride copolymers, and naphthalenesulfonic acid salt formalin condensates.

The cationic surfactants for use in the invention are not particularly limited, and known ones can be used. Examples thereof include alkylamine salts, quaternary ammonium salts, polyoxyethylene alkylamine salts, and polyethylene polyamine derivatives.

The amphoteric surfactants for use in the invention are not particularly limited, and known ones can be used. Examples thereof include carboxybetaines, aminocarboxylic acids, sulfobetaines, aminosulfuric acid esters, and imidazoline compounds.

In the surfactant names enumerated above, the term "polyoxyethylene" can be replaced by "polyoxyalkylene" such as polyoxymethylene, polyoxypropylene, or polyoxybutylene. These surfactants also can be used in the invention.

More preferred examples of the surfactant include fluorochemical surfactants having a perfluoroalkyl group in the molecule. Examples of such fluorochemical surfactants include anionic ones such as perfluoroalkylcarboxylic acid salts, perfluoroalkylsulfonic acid salts, and perfluoroalkylphosphoric acid esters; amphoteric ones such as perfluoroalkyl betaines; cationic ones such as perfluoroalkyltrimethylammonium salts; and nonionic ones such as perfluoroalkylamine oxides, perfluoroalkyl ethylene oxide adducts, oligomers having a perfluoroalkyl group and a hydrophilic group, oligomers having a perfluoroalkyl group and an ink-receptivity group, oligomers having a perfluoroalkyl group, hydrophilic group, and ink-receptivity group, and urethanes having a perfluoroalkyl group and an ink-receptivity group. Furthermore, the fluorochemical surfactants described in JP-A-62-170950, JP-A-62-226143, and JP-A-60-168144 are also preferred.

Surfactants can be used alone or in combination of two or more thereof.

The amount of the surfactant to be contained is preferably from 0.001 to 10% by weight, more preferably from 0.01 to 5% by weight, based on all solid components of the image-recording layer.

<Colorant>

A dye showing intense absorption in the visible light region can be used as a colorant for images in the image-recording layer in the invention. Examples thereof include Oil Yellow #101, Oil Yellow #103, Oil Pink #312, Oil Green BG, Oil Blue BOS, Oil Blue #603, Oil Black BY, Oil Black BS, and Oil Black T-505 (all manufactured by Orient Chemical Industries Ltd.), Victoria Pure Blue, Crystal Violet (CI 42555), Methyl Violet (CI 42535), Ethyl Violet, Rhodamine B (CI 145170B), Malachite Green (CI 42000), Methylene Blue (CI 52015), and the dyes shown in JP-A-62-293247. Furthermore, pigments such as phthalocyanine pigments, azo pigments, carbon black, and titanium oxide can also be advantageously used.

<Printing-Out Agent>

A compound which changes in color by the action of an acid or radical can be added to the image-recording layer in the invention in order to form a print-out image. As this compound can be effectively used various dyes such as, e.g., diphenylmethane, triphenylmethane, thiazine, oxazine, xanthene, anthraquinone, iminoquninone, azo, and azomethine dyes.

Examples thereof include dyes such as Brilliant Green, Ethyl Violet, Methyl Green, Crystal Violet, Basic Fuchsine, Methyl Violet 2B, Quinaldine Red, Rose Bengal, Metanil Yellow, Thymolsulfophthalein, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Parafuchsine, Victoria Pure Blue BOH (manufactured by Hodogaya Chemical Co., Ltd.), Oil Blue #603 (manufactured by Orient Chemical Industries Ltd.), Oil Pink #312 (manufactured by Orient Chemical Industries Ltd.), Oil Red 5B (manufactured by Orient Chemical Industries Ltd.), Oil Scarlet #308 (manufactured by Orient Chemical Industries Ltd.), Oil Red OG (manufactured by Orient Chemical Industries Ltd.), Oil Red RR (manufactured by Orient Chemical Industries Ltd.), Oil Green #502 (manufactured by Orient Chemical Industries Ltd.), Spiron Red BEH Special (manufactured by Hodogaya Chemical Co., Ltd.), m-Cresol Purple, Cresol Red, Rhodamine B, Rhodamine 6G, Sulfo Rhodamine B, Auramine, 4-p-diethylaminophenyliminonaphthoquinone, 2-carboxyanilino-4-p-diethylaminophenyliminonaphthoquuinone, 2-carboxystearylamino-4-p-N,N-bis(hydroxyethyl)aminophenyliminonaphthoquinone, 1-phenyl-3-methyl-4-p-diethylaminophenylimino-5-pyrazolone, and 1-β-naphthyl-4-p-diethylaminophenylimino-5-pyrazolone and leuco dyes such as p,p',p"-hexamethyltriaminotriphenylmethane (Leuco Crystal Violet) and Pergascript Blue SRB (manufactured by Ciba-Geigy Ltd.).

Besides those, the leuco dyes known as materials for heat-sensitive papers or pressure-sensitive papers are included in preferred examples. Specifically, examples thereof include crystal violet lactone, malachite green lactone, benzoyl leuco methylene blue, 2-(N-phenyl-N-methylamino)-6-(N-p-tolyl-N-ethyl)aminofluoran, 2-anilino-3-methyl-6-(N-ethyl-p-toluidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N,N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino)fluoran, 3-(N,N-diethylamino)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-azaphthalide, and 3-(4-diethylaminophenyl)-3-(1-ethyl-2-methylindol-3-yl)phthalide.

The dye changing in color by the action of an acid or radical may be added in an amount of preferably from 0.01 to 10% by weight based on all solid components of the image-recording layer.

<Heat Polymerization Inhibitor>

A heat polymerization inhibitor may be added in a small amount to the image-recording layer in the invention in order to prevent the polymerizable compound (C) from unnecessarily undergoing heat polymerization during the production or storage of the image-recording layer.

Preferred examples of the heat polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitroso-N-phenylhydroxylamine aluminum salt.

The heat polymerization inhibitor is preferably contained in an amount of about from 0.01 to 5% by weight based on all solid components of the image-recording layer.

<Higher Fatty Acid Derivative, etc.>

A higher fatty acid derivative or the like, such as behenic acid or behenamide, may be added to the image-recording layer in the invention so as to become present in a higher concentration in the image-recording layer surface during drying after coating, for the purpose of preventing the polymerization inhibition caused by oxygen. The amount of the higher fatty acid derivative to be added is preferably about from 0.1 to 10% by weight based on all solid components of the image-recording layer.

<Plasticizer>

The image-recording layer in the invention may contain a plasticizer so as to have improved on-press developability.

Examples of the plasticizer include phthalic esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate, and diallyl phthalate; glycol esters such as dimethyl glycol phthalate, ethyl phthalyl ethyl glycolate, methyl phthalyl ethyl glycolate, butyl phthalyl butyl glycolate, and triethylene glycol dicaprylate; phosphoric esters such as tricresyl phosphate and triphenyl phosphate; aliphatic dibasic acid esters such as diisobutyl adipate, dioctyl adipate, dimethyl sebacate, dibutyl sebacate, dioctyl azelate, and dibutyl maleate; and poly(glycidyl methacrylate), triethyl citrate, glycerol triacetyl ester, and butyl laurate.

Such a plasticizer may be incorporated into the image-recording layer in a proportion of about 30% by weight or lower.

<Fine Inorganic Particles>

The image-recording layer in the invention may contain fine inorganic particles for the purposes of enhancing interfacial adhesion by surface roughening and of improving cured-film strength in image areas and improving the removability of nonimage areas in on-press development.

Preferred examples of the fine inorganic particles include silica, alumina, magnesium oxide, titanium oxide, magnesium carbonate, calcium alginate, and mixtures thereof.

Such fine inorganic particles have an average particle diameter of preferably from 5 nm to 10 μm, more preferably from 0.5 μm to 3 μm. When the fine inorganic particles have an average particle diameter within that range, the particles are stably dispersed in the image-recording layer to enable the image-recording layer to retain sufficient film strength and give nonimage areas which have excellent hydrophilicity and are less susceptible to scumming during printing.

The fine inorganic particles described above are easily available as commercial products, e.g., colloidal silica dispersions.

The amount of the fine inorganic particles to be contained is preferably 20% by weight or smaller, more preferably 10% by weight or smaller, based on all solid components of the image-recording layer.

<Low-Molecular Hydrophilic Compound>

The image-recording layer in the invention may contain a hydrophilic low-molecular compound so as to have improved on-press developability. Examples of the hydrophilic low-molecular compound include the following water-soluble organic compounds: glycols such as ethylene glycol, diethylene glycol, triethylene glycol, propylene glycol, dipropylene glycol, and tripropylene glycol and ether or ester derivatives of these; polyhydroxy compounds such as glycerol and pentaerythritol; organic amines such as triethanolamine, diethanolamine, and monoethanolamine and salts of these; organic sulfonic acids such as toluenesulfonic acid and benzenesulfonic acid and salts of these; organic phosphonic acids such as phenylphosphonic acid and salts thereof; and organic carboxylic acids such as tartaric acid, oxalic acid, citric acid, malic acid, lactic acid, gluconic acid, and amino acids and salts of these.

The amount of the low-molecular hydrophilic compound to be contained is preferably up to 30% by weight based on all solid components of the image-recording layer.

<Formation of Image-Recording Layer[

As methods usable for incorporating the above-described ingredients for image-recording layer constitution into an image-recording layer in the invention, there are several embodiments. One embodiment of the image-recording layer is a molecule dispersion type image-recording layer formed by dissolving the constituted ingredients in an appropriate solvent and applying the solution, as described in, e.g., JP-A-2002-287334. Another embodiment is a microcapsule type image-recording layer which contains all or part of ingredients (A) to (D) in a microencapsulated form, as described in, e.g., JP-A-2001-277740 and JP-A-2001-277742. In the microcapsule type image-recording layer, the constituent ingredients may be contained also outside the microcapsules. A preferred embodiment of the microcapsule type image-recording layer contains hydrophobic constituent ingredients in microcapsules and contains hydrophilic constituent ingredients outside the microcapsules. For obtaining better on-press developability, it is advantageous to form the image-recording layer as a microcapsule type image-recording layer.

For microencapsulating the ingredients for constituting the image-recording layer, known methods can be used. Examples of processes for microcapsule production include: the method utilizing coacervation as described in U.S. Pat. Nos. 2,800,457 and 2,800,458; the method based on interfacial polymerization as described in U.S. Pat. No. 3,287,154, JP-B-38-19574, and JP-B-42-446; the method based on polymer deposition as described in U.S. Pat. Nos. 3,418,250 and 3,660,304; the method using an isocyanate polyol wall material as described in U.S. Pat. No. 3,796,669; the method using an isocyanate wall material as described in U.S. Pat. No. 3,914,511; the method using a urea-formaldehyde or urea-formaldehyde-resorcinol wall-forming material as described in U.S. Pat. Nos. 4,001,140, 4,087,376, and 4,089,802; the method using a wall material such as a melamine-formaldehyde resin or hydroxycellulose as described in U.S. Pat. No. 4,025,445; the in-situ method based on monomer polymerization as described in JP-B-36-9163 and JP-B-51-9079; the spray drying method as described in British Patent No. 930,422 and U.S. Pat. No. 3,111,407; and the electrolytic dispersion cooling method as described in British Patents Nos. 952,807 and 967,074. However, usable methods for microencapsulation should not be construed as being limited to these examples.

Preferred microcapsule walls for use in the invention have three-dimensional crosslinks and have the property of swelling with solvents. From this standpoint, preferred materials of microcapsule walls are polyureas, polyurethanes, polyesters, polycarbonates, polyamides, and mixtures thereof. Especially preferred are polyureas and polyurethanes. A compound having a crosslinkable functional group capable of being incorporated into the binder polymer, such as, e.g., an ethylenically unsaturated bond, may be incorporated into microcapsule walls.

Such microcapsules may thermally unite with one another or may be ones which do not undergo such uniting. The point is that the microcapsules are not limited as long as that ingredient among the contents of the microcapsules which has migrated to the microcapsule surface or oozed out of the microcapsules during application or which has infiltrated into the microcapsule wall thermally undergoes a chemical reaction. The microcapsules may react with a hydrophilic resin added or with a low-molecular compound added. It is also possible to prepare two or more kinds of microcapsules respectively having different functional groups thermally reacting with each other to thereby react the microcapsules with each other. Although the thermal fusion bonding of microcapsules to one another is hence preferred in image formation, it is not essential.

The amount of the microcapsules to be added to the image-recording layer (image-forming layer) is preferably 50% by weight or larger, more preferably from 60 to 95% by weight, on a solid basis based on the solid components of the image-recording layer. When the microcapsule amount is within this range, satisfactory sensitivity and satisfactory printing durability are obtained simultaneously with satisfactory developability.

The average particle diameter of the microcapsules is preferably from 0.01 to 3.0 μm, more preferably from 0.05 to 2.0 μm, especially preferably from 0.10 to 1.0 μm. When the average microcapsule diameter is within this range, satisfactory resolution and long-term stability are obtained.

In the case where microcapsules are incorporated into the image-recording layer in the invention, a solvent in which the contents of the microcapsules dissolve and with which the wall material swells can be added to the dispersion medium to be used for the microcapsules. This solvent accelerates the diffusion of the encapsulated compound having a thermally reactive functional-group outside the microcapsules. Such a solvent can be easily selected from many commercial solvents although it depends on the microcapsule dispersion medium, material and thickness of the microcapsule walls, contents of the microcapsules, etc. In the case of, e.g., water-dispersible microcapsules whose walls are made of a crosslinked polyurea or polyurethane, preferred examples of the solvent include alcohols, ethers, acetals, esters, ketones, polyhydric alcohols, amides, amines, and fatty acids.

Specific examples of those solvents include methanol, ethanol, tert-butanol, n-propanol, tetrahydrofuran, methyl lactate, ethyl lactate, methyl ethyl ketone, propylene glycol monomethyl ether, ethylene glycol diethyl ether, ethylene glycol monomethyl ether, y-butyrolactone, N,N-dimethylformamide, and N,N-dimethylacetamide. However, the solvents should not be construed as being limited to these examples. Two or more of these solvents may be used. A solvent which does not dissolve in the microcapsule dispersion medium but dissolves therein when any of those solvents is mixed therewith can also be used.

The amount of such a solvent to be added is determined by material combinations. However, it is usually effective to add the solvent in an amount of from 5 to 95% by weight based on the coating fluid. A preferred range of the solvent amount is from 10 to 90% by weight, and a more preferred range thereof is from 15 to 85% by weight.

The image-recording layer in the invention is formed by dispersing or dissolving necessary constituent ingredients in a solvent by using any of the embodiments described above to prepare a coating fluid and applying the coating fluid.

Examples of the solvent to be used here include ethylene dichloride, cyclohexanone, methyl ethyl ketone, methanol, ethanol, propanol, ethylene glycol monomethyl ether, 1-methoxy-2-propanol, 2-methyoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, and water. However, the solvent should not be construed as being limited to these examples. These solvents may be used alone or as a mixture thereof. The solid concentration of the coating fluid is preferably from 1 to 50% by weight.

It is also possible to form the image-recording layer according to the invention by dispersing or dissolving the same or different ingredients described above in the same or different solvents to prepare two or more coating fluids and repeatedly conducting application and drying.

The amount of the image-recording layer to be formed by coating (on a dry basis) is preferably from 0.3 to 1.5 $g/m^2$, more preferably from 0.5 to 1.5 $g/m^2$.

For applying the coating fluid, various methods can be used. Examples thereof include bar coater coating, spin coating, spray coating, curtain coating, dip coating, air knife coating, blade coating, and roll coating.

[Overcoat Layer]

In the lithographic printing plate precursor of the invention, an overcoat layer (protective layer) capable of being removed with a printing ink or a fountain solution or with both can be formed on the image-recording layer for the purposes of preventing the image-recording layer from suffering mars, shutting off oxygen, preventing aberration in high-illuminance laser exposure, etc.

In the invention, exposure is usually conducted in the air. The overcoat layer serves to prevent low-molecular compounds present in the air, such as, e.g., oxygen and basic substances, which inhibit the image-forming reaction caused in the image-recording layer by exposure, from coming into the image-forming layer to thereby prevent the image-forming reaction from being inhibited by exposure in the air. Consequently, the overcoat layer is desired to have the following properties: to have low permeability to low-molecular compounds including oxygen; to satisfactorily transmit the light to be used for exposure; to have excellent adhesion to the image-recording layer; and to be capable of being easily removed in an on-press development step after exposure. Various investigations have hitherto been made on overcoat layers having such properties. Such overcoat layers are described in, e.g., U.S. Pat. No. 3,458,311 and JP-B-55-49729.

Examples of materials for the overcoat layer include water-soluble polymeric compounds having relatively excellent crystallinity. Specific examples thereof include water-soluble polymers such as poly(vinyl alcohol), polyvinylpyrrolidone, acid celluloses, gelatin, gum arabic, and poly(acrylic acid). Of these, poly(vinyl alcohol) (PVA), when used as the main component, gives most satisfactory results concerning basic properties such as oxygen barrier properties and removability in development. As long as the poly(vinyl alcohol) contains unsubstituted vinyl alcohol units, which impart the oxygen barrier properties and water solubility required of the overcoat layer, it may be one which has been partly substituted with an ester, ether, or acetal or may be one which partly has other comonomer units.

Examples of the poly(vinyl alcohol) include ones having a degree of hydrolysis of from 71 to 100% by mole and a molecular weight in the range of from 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8, manufactured by Kuraray Co., Ltd.

Ingredients for the overcoat layer (selection of PVA, use of additives, etc.), the amount of the layer to be formed by coating, etc. are suitably selected while taking account of susceptibility to fogging, adhesion, marring resistance, and the like besides oxygen barrier properties and removability in development. In general, the higher the degree of hydrolysis of the PVA (i.e., the higher the content of unsubstituted vinyl alcohol units in the overcoat layer) and the larger the film thickness, the higher the oxygen barrier properties and the more the overcoat layer is preferred from the standpoint of sensitivity. Furthermore, it is preferred to regulate oxygen permeability so as not to be too high, in order to prevent an unnecessary polymerization reaction from occurring during production and storage and to prevent undesirable fogging, line thickening, or the like in imagewise exposure. Consequently, the oxygen permeability A as measured at 25° C. and 1 atm is preferably in the range of $0.2 \leqq A \leqq 20$ ($cc/m^2 \cdot day$).

Those (co)polymers including poly(vinyl alcohol) (PVA) which have a molecular weight in the range of from 2,000 to 10,000,000 can be used. Preferably, the molecular weight thereof is in the range of from 20,000 to 3,000,000.

Other ingredients for the overcoat layer include the following. Glycerol, dipropylene glycol, or the like may be added in an amount of several percents by weight based on the (co) polymer to impart flexibility. Furthermore, an anionic surfactant such as a sodium alkyl sulfate or sodium alkylsulfonate, an amphoteric surfactant such as an alkylaminocarboxylic acid salt or alkylaminodicarboxylic acid salt, or a nonionic surfactant such as a polyoxyethylene alkylphenyl ether can be added in an amount of several percents by weight based on the (co)polymer.

The adhesion of the overcoat layer to the image-recording layer and the marring resistance or the like of the overcoat layer are also significantly important in the handling of the lithographic printing plate precursor. This is because when an overcoat layer which comprises a water-soluble polymeric compound and is hence hydrophilic is superposed on the image-recording layer, which is hydrophobic, then the overcoat layer is apt to peel off due to insufficient adhesive force. There are cases where defects such as, e.g., film cure failures caused by polymerization inhibition by oxygen are developed in the areas from which the overcoat layer has peeled off.

Various proposals have been made on improvements of adhesion between an image-recording layer and an overcoat layer to eliminate such failures. For example, JP-A-49-70702 and British Patent Application Publication No. 1,303,578 describe a technique in which a hydrophilic polymer consisting mainly of poly (vinyl alcohol) is mixed with 20 to 60% by weight acrylic emulsion, water-insoluble vinylpyrrolidone/vinyl acetate copolymer, or the like and this mixture is applied to an image-recording layer to form a layer thereon to thereby obtain sufficient adhesion. Any of these known techniques can be used in the invention. Coating methods for overcoat layer formation are described in detail in, e.g., U.S. Pat. No. 4,458,311 and JP-B-55-49729.

Other functions can be imparted to the overcoat layer. For example, a colorant which highly transmits infrared rays to be used for exposure and is capable of efficiently absorbing light having other wavelengths (e.g., a water-soluble dye) is added to thereby improve suitability for handling in safelight without causing a decrease in sensitivity.

The thickness of the overcoat layer is desirably from 0.1 to 5 μm, especially desirably from 0.2 to 2 μm.

[Support]

The support to be used in the lithographic printing plate precursor of the invention is not particularly limited as long as it is a platy material having dimensional stability. Examples thereof include paper, paper laminated with a plastic (e.g., polyethylene, polypropylene, or polystyrene), metal sheets (e.g., aluminum, zinc, and copper), plastic films (e.g., cellulose diacetate, cellulose triacetate, cellulose propionate, cellulose butyrate, cellulose acetate butyrate, cellulose nitrate, poly(ethylene terephthalate), polyethylene, polystyrene, polypropylene, polycarbonates, and poly (vinyl acetal)), and paper or plastic films to which any of those metals has been laminated or vapor-deposited. Preferred examples of the support include polyester films and aluminum sheets. Of these, aluminum sheets are preferred because they have satisfactory dimensional stability and are relatively inexpensive.

The aluminum sheets are sheets of pure aluminum, sheets of an alloy of aluminum as the main component with a slight amount of one or more other elements, or ones comprising a thin film of aluminum or an aluminum alloy and a plastic laminated thereto. Examples of the non-aluminum elements contained in the aluminum alloy include silicon, iron, manganese, copper, magnesium, chromium, zinc, bismuth, nickel, and titanium. The content of such non-aluminum elements in the alloy is preferably up to 10% by weight. Although a sheet of pure aluminum is preferred in the invention, an aluminum sheet containing a slight amount of non-aluminum elements may be used because completely pure aluminum is difficult to produce by the current refining technology. The aluminum sheet to be used is not limited in composition and can be suitably selected from sheets of known aluminum materials in general use.

The thickness of the support is preferably from 0.1 to 0.6 mm, more preferably from 0.15 to 0.4 mm, even more preferably from 0.2 to 0.3 mm.

Before being used, the aluminum sheet is preferably subjected to a surface treatment such as a surface-roughening treatment or anodization treatment. Such a surface treatment facilitates the attainment of improved hydrophilicity and adhesion between an image-recording layer and the support. Before being subjected to a surface-roughening treatment, the aluminum sheet may be degreased according to need with a surfactant, organic solvent, alkaline aqueous solution, or the like to remove a rolling oil remaining on the surface thereof.

The surface-roughening treatment of the aluminum sheet may be conducted by various methods. Examples thereof include mechanical surface-roughening treatment, electrochemical surface-roughening treatment (surface-roughening treatment in which a surface layer is electrochemically dissolved away), and chemical surface-roughening treatment (surface-roughening treatment in which the surface is selectively dissolved away chemically).

For the mechanical surface-roughening treatment, known techniques can be used, such as ball polishing, brushing, blasting, and buffing.

Examples of techniques for the electrochemical surface-roughening treatment include a method in which the aluminum sheet is treated in an electrolytic solution containing an acid, e.g., hydrochloric acid or nitric acid, while applying an alternating or direct current thereto. Examples thereof further include the method using a mixed acid as described in JP-A-54-63902.

The aluminum sheet which has undergone a surface-roughening treatment is subjected according to need to an alkali etching treatment with an aqueous solution of potassium hydroxide, sodium hydroxide, or the like and then to a neutralization treatment. Thereafter, the aluminum sheet may be subjected to an anodization treatment for enhancing wearing resistance according to need.

For the anodization treatment of the aluminum sheet, various electrolytes which enable the formation of a porous oxide film can be used. In general, sulfuric acid, hydrochloric acid, oxalic acid, chromic acid, or a mixture of two or more of these acids is used. The concentration of any of these electrolytes is suitably determined according to the kind of the electrolyte.

Conditions for the anodization treatment cannot be unconditionally specified because they vary over a wide range according to the electrolyte to be used. In general, however, the conditions preferably include an electrolyte concentration in the solution of from 1 to 80% by weight, solution temperature of from 5 to 70° C., current density of from 5 to 60 A/$dm^2$, voltage of from 1 to 100 V, and electrolysis period of from 10 seconds to 5 minutes. The amount of the anodized film to be formed by anodization is preferably from 1.0 to 5.0 g/$m^2$, more preferably from 1.5 to 4.0 g/$m^2$. When the amount of the anodized film is within this range, satisfactory printing durability and the satisfactory marring resistance of nonimage areas of the lithographic printing plate are obtained.

After the anodization treatment, the surface of the aluminum sheet is subjected to a hydrophilic treatment according to need. Methods for the hydrophilic treatment include the alkali metal silicate method described in U.S. Pat. Nos. 2,714,066, 3,181,461, 3,280,734, and 3,902,734. In this method, the support is treated by immersing it in an aqueous solution of sodium silicate or the like or by electrolysis in the solution. Examples thereof further include the method in which the support is treated with potassium fluorozirconate as described in JP-B-36-22063 and the method in which the support is treated with poly(vinylphosphonic acid) as described in U.S. Pat. Nos. 3,276,868, 4,153,461, and 4,689,272.

The support preferably has a center-line average surface roughness of from 0.10 to 1.2 μm. When the surface roughness of the support is within this range, satisfactory adhesion to an image-recording layer, satisfactory printing durability, and satisfactory unsusceptibility to scumming are obtained.

The color density of the support is preferably from 0.15 to 0.65 in terms of the value of reflection density. When the color density of the support is within this range, not only halation during imagewise exposure is prevented to attain satisfactory image formation but also satisfactory suitability for plate inspection after development is obtained.

[Back Coat]

A back coat can be formed on the back side of the support according to need after the support has undergone a surface treatment or after an undercoat layer has been formed.

Preferred examples of the back coat include a coating layer made of the organic polymeric compound described in JP-A-5-45885 or of the metal oxide obtained by hydrolyzing and condensation-polymerizing an organometallic compound or inorganic metal compound as described in JP-A-6-35174. Preferred of these materials are alkoxy compounds of silicon, such as $Si(OCH_3)_4$, $Si(OC_2H_5)_4$, $Si(OC_3H_7)_4$, and $Si(OC_4H_9)_4$. This is because starting materials for such silicon compounds are easily available at low cost.

[Platemaking, Printing]

In the lithographic printing method of the invention, the lithographic printing plate precursor of the invention described above is imagewise exposed with an infrared laser.

The infrared laser to be used in the invention is not particularly limited. However, preferred examples thereof include solid lasers and semiconductor lasers which emit infrared rays having a wavelength of from 760 to 1,200 nm. The output of the infrared laser is preferably 100 mW or higher. For reducing the period of exposure, it is preferred to use a multi-beam laser device.

The exposure period for each pixel is preferably 20 μsec or shorter. The quantity of irradiation energy is preferably from 10 to 300 mJ/$cm^2$.

In the lithographic process of the invention, the lithographic printing plate precursor of the invention which has undergone imagewise exposure with an infrared laser as described above is then used, without via any development step, to conduct printing while supplying an oil-based ink and an aqueous ingredient thereto.

Examples of methods for the process include: a method in which the lithographic printing plate precursor is exposed with an infrared laser and then mounted, without via a development step, on a printing machine to conduct printing; and a method in which the lithographic printing plate precursor is mounted on a printing machine, subsequently exposed with an infrared laser on the printing machine, and then used to conduct printing without via a development step.

When the lithographic printing plate precursor is imagewise exposed with an infrared laser and an aqueous ingredient and an oil-based ink are supplied to the exposed precursor to conduct printing without via a development step such as, e.g., a wet development step, then the image-recording layer in its exposed areas, which has been cured by the exposure, forms oil-based-ink-receiving parts having a lipophilic surface. On the other hand, in the unexposed areas, the uncured image-recording layer is dissolved or dispersed in the aqueous ingredient and/or oil-based ink supplied and thus removed therewith to uncover the hydrophilic surface in these areas.

As a result, the aqueous ingredient adheres to the uncovered hydrophilic surface, while the oil-based ink adheres to the image-recording layer in the exposed areas to initiate printing. In this operation, the liquid to be supplied first to the plate surface may be either the aqueous ingredient or the oil-based ink. It is, however, preferred to supply the oil-based ink first from the standpoint of preventing the aqueous ingredient from being contaminated with the image-recording layer located in the unexposed areas. As the aqueous ingredient and the oil-based ink may be used an ordinary a fountain solution for lithography and an ordinary printing ink for lithography.

The lithographic printing plate precursor is developed on an offset press in the manner described above and directly used for printing on many sheets.

EXAMPLES

The invention will be explained below in detail by reference to Examples and Comparative Examples, but the invention should not be construed as being limited to these Examples.

Synthesis of Copolymer Represented by Compound Example 70

While 133.96 g of N,N-dimethylacetamide was kept being stirred in a nitrogen stream with heating at 70° C., a solution consisting of 21.86 g of Phosmer PE (manufactured by Uni-Chemical Co., Ltd.), 37.31 g of 2-acrylamido-2-methylpropanesulfonic acid (manufactured by Tokyo Kasei Kogyo Co., Ltd.), 7.81 g of 2-hydroxyethyl methacrylate, 0.745 g of 2,2'-azobis(2,4-dimethylvaleronitrile) (manufactured by Wako Pure Chemical Industries, Ltd.), and 133.96 g of N,N-dimethylacetamide was added dropwise thereto over 2 hours. This mixture was reacted at that temperature for 2 hours. Thereafter, 0.745 g of 2,2'-azobis (2,4-dimethylvaleronitrile) was added thereto and this mixture was heated to 80° C. and reacted for further 2 hours. After the mixture was cooled to room temperature, 27.93 g of methacryloyloxyethyl isocyanate (manufactured by Showa Denko K.K.), 0.2 g of di-n-butyltin dilaurate (manufactured by Tokyo Kasei Kogyo Co., Ltd.), 111.72 g of N,N-dimethylacetamide, and 0.2 g of p-methoxyphenol (manufactured by Wako Pure Chemical Industries, Ltd.) were added thereto. The resultant mixture was stirred at 65° C. for 12 hours in a nitrogen stream. This mixture was cooled to room temperature and then poured into ethyl acetate to separate a polymer. This polymer was dissolved in 200 mL of methanol, and the solution was cooled to 0° C. Thereto was added 126 g of a 20% by weight aqueous solution of sodium acetate. The polymer solution obtained was poured into acetone to obtain a polymer powder. Subsequently, the polymer powder was dissolved in 200 mL of methanol, and 20 g of methanesulfonic acid was added thereto. This mixture was sufficiently stirred. The resultant solution was poured into acetone and the powder precipitated was dried. Thus, a copolymer (70) was obtained in an amount of 70.5 g (copolymerization proportion x/y/z/w=20/20/40/20; weight-average molecular weight, 11,000).

1. Production of Lithographic Printing Plate Precursor (1) Production of Support An aluminum sheet (material, 1050) having a thickness of 0.3 mm was subjected to a degreasing treatment with 10% by weight aqueous sodium aluminate solution at 50° C. for 30 seconds in order to remove the rolling oil remaining on the surface thereof. Thereafter, the aluminum surface was grained with three brushes having nylon bundles set therein having a bristle diameter of 0.3 mm and with an aqueous suspension of pumice having a median diameter of 25 μm (specific gravity of the suspension, 1.1 g/$cm^3$), and then sufficiently washed with water. This sheet was immersed for 9 seconds in 25% aqueous sodium hydroxide solution having a temperature of 45° C. to conduct etching and then washed with water. Thereafter, the sheet was immersed in 20% nitric acid at 60° C. for 20 seconds and washed with water. In this operation, the amount of the grained surface layer removed by etching was about 3 g/$m^2$.

Subsequently, an electrochemical surface-roughening treatment was continuously conducted using a 60-Hz AC voltage. The electrolytic solution used for this treatment was 1% by weight aqueous nitric acid solution (containing 0.5% by weight aluminum ions) and the temperature of the solution was 50° C. The AC power source used was one providing a trapezoidal rectangular wave alternating current wherein the TP, which is the time required for the current value to increase from zero to a peak, was 0.8 msec and the duty ratio was 1:1. A carbon electrode was used as a counter electrode to conduct the electrochemical surface-roughening treatment using ferrite as an auxiliary anode. The current density was 30 A/$dm^2$ in terms of peak value. To the auxiliary anode was supplied 5% of the current flowing from the power source. The quantity of electricity in the nitric acid electrolysis was 175 C/$dm^2$ in terms of the quantity of electricity at the time when the aluminum sheet was functioning as an anode. After this treatment, the aluminum sheet was washed with water by spraying.

Thereafter, an electrochemical surface-roughening treatment with an electrolytic solution consisting of 0.5% by weight aqueous hydrochloric acid solution (containing 0.5% by weight aluminum ions) and having a temperature of 50° C. was conducted under the conditions of a quantity of electricity of 50 C/$dm^2$ at the time when the aluminum sheet was functioning as an anode, in the same manner as in the nitric acid electrolysis. The sheet was then water-washed by spraying. This sheet was subjected to direct-current anodization at a current density of 15 A/$dm^2$ using 15% sulfuric acid (containing 0.5% by weight aluminum ions) as an electrolytic solution to deposit a direct-current anodized film in an amount of 2.5 g/$m^2$, subsequently washed with water and dried, and then treated with 2.5% by weight aqueous sodium silicate solution at 30° C. for 10 seconds. The support thus obtained was examined for center-line average surface roughness (Ra) with a pointer having a diameter of 2 μm. As a result, the average surface roughness thereof was found to be 0.51 μm.

(2) Formation of Image-Recording Layer

Example 1

A methanol solution of a copolymer represented by Compound Example 4 (x/y=80/20; weight-average molecular weight, 15,000) was applied to the support produced above and then dried in an oven at 70° C. for 30 seconds to form an undercoat layer in an amount of 10 mg/$m^2$ on a dry basis.

Subsequently, a coating fluid for image-recording layer formation which had the following composition was applied by bar coating and then dried in an oven at 70° C. for 60 seconds to form an image-recording layer in an amount of 0.8 g/$m^2$ on a dry basis. Thus, a lithographic printing plate precursor was obtained.

| Coating Fluid for Image-Recording Layer Formation (1) | |
|---|---|
| Water | 100 g |
| Microcapsules (1) shown below (on solid basis) | 5 g |
| Polymerization initiator (1) shown below | 0.5 g |
| Fluorochemical surfactant (1) shown below | 0.2 g |

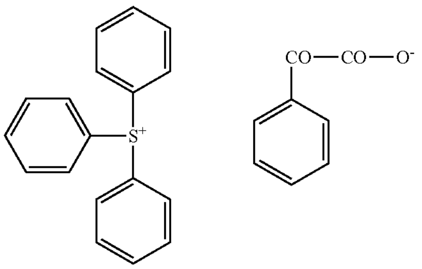

Polymerization Initiator (1)

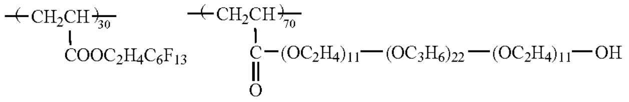

Fluorochemical Surfactant (1)

(Synthesis of Microcapsules (1))

In 17 g of ethyl acetate were dissolved 10 g of a trimethylolpropane/xylene diisocyanate adduct (Takenate D-110N, manufactured by Mitsui Takeda Chemicals, Inc.), 3.15 g of pentaerythritol triacrylate (SR444, manufactured by Nippon Kayaku Co., Ltd.), 0.35 g of infrared absorber (1) shown below, and 0.1 g of Pionin A-41C (manufactured by Takemoto Oil & Fat Co., Ltd.). Thus, an oily-phase ingredient was prepared. A 4% by weight aqueous solution of PVA-205 was prepared as an aqueous-phase ingredient in an amount of 40 g. The oily-phase ingredient was mixed with the aqueous-phase ingredient, and this mixture was emulsified by treatment with a homogenizer at 12,000 rpm for 10 minutes. The emulsion obtained was added to 25 g of distilled water, and this mixture was stirred at room temperature for 30 minutes and then at 40° C. for 3 hours. The microcapsule suspension thus obtained was diluted with distilled water so as to result in a solid concentration of 20% by weight. The average particle diameter of the suspension was 0.3 μm.

Infrared Absorber (1)

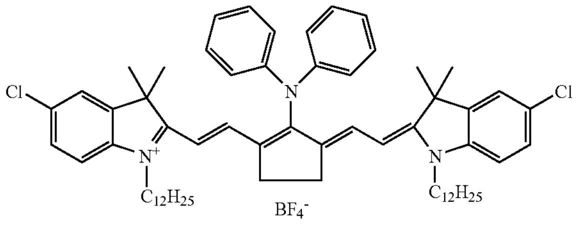

Examples 2 to 8

Lithographic printing plate precursors were obtained in the same manner as in Example 1, except that each of the compounds shown in Table 1 was used in place of the copolymer represented by Compound Example 4.

TABLE 1

| | Copolymer Example | Copolymerization proportion (molar ratio), Weight-average molecular weight |
|---|---|---|
| Example 2 | 8 | x/y = 40/60, Mw = 15000 |
| Example 3 | 19 | x/y/z = 40/30/30, Mw = 17000 |
| Example 4 | 22 | x/y = 60/40, Mw = 12000 |
| Example 5 | 31 | x/y/z = 30/30/40, Mw = 11000 |
| Example 6 | 43 | x/y = 70/30, Mw = 25000 |
| Example 7 | 50 | x/y/z = 30/40/30, Mw = 16000 |
| Example 8 | 55 | x/y/z = 20/40/40, Mw = 8000 |

Comparative Example 1

A lithographic printing plate precursor was obtained in the same manner as in Example 1, except that the undercoat layer comprising the copolymer represented by Compound Example 4 was not formed.

Example 9

A methanol solution of a copolymer represented by Compound Example 43 (x/y=80/20 (molar ratio); weight-average molecular weight, 25,000) was applied to the support produced above and then dried in an oven at 70° C. for 30 seconds to form an undercoat layer in an amount of 10 mg/$m^2$ on a dry basis.

Subsequently, a coating fluid for image-recording layer formation which had the following composition was applied by bar coating and then dried in an oven at 100° C. for 60 seconds to form an image-recording layer in an amount of 1.0 g/$m^2$ on a dry basis. Thus, a lithographic printing plate precursor was obtained.

TABLE 2

| | Copolymer Example | Copolymerization proportion (molar ratio), Weight-average molecular weight |
|---|---|---|
| Example 10 | 4 | x/y = 70/30, Mw = 12000 |
| Example 11 | 12 | x/y = 80/20, Mw = 9000 |
| Example 12 | 20 | x/y/z = 50/40/10, Mw = 12000 |
| Example 13 | 27 | x/y/z = 40/40/20, Mw = 8000 |
| Example 14 | 28 | x/y = 50/50, Mw = 8000 |
| Example 15 | 45 | x/y = 80/20, Mw = 15000 |
| Example 16 | 49 | x/y = 70/30, Mw = 14000 |
| Example 17 | 52 | x/y/z = 40/30/30, Mw = 12000 |
| Example 18 | 59 | x/y/z = 60/20/20, Mw = 7000 |

Comparative Example 2

A lithographic printing plate precursor was obtained in the same manner as in Example 9, except that the undercoat layer comprising the copolymer represented by Compound Example 43 was not formed.

| Coating Fluid for Image-Recording Layer Formation (2) | |
|---|---|
| Infrared absorber (2) shown below | 0.05 g |
| Polymerization initiator (1) shown above | 0.2 g |
| Binder polymer (1) shown below b (average molecular weight, 80,000) | 0.5 g |
| Polymerizable compound Isocyanuric acid EO-modified triacrylate (NK Ester M-315, manufactured by Shin-Nakamura Chemical Co., Ltd.) | 1.0 g |
| Fluorochemical surfactant (1) shown above | 0.1 g |
| Methyl ethyl ketone | 18.0 g |

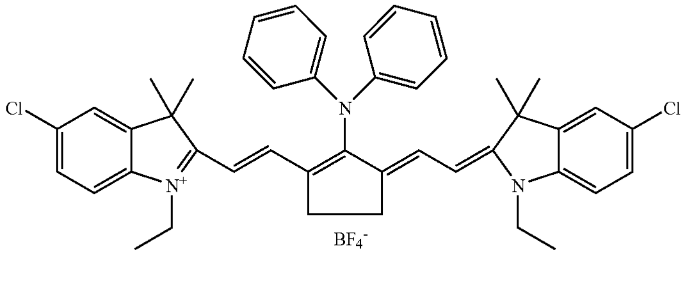

Infrared Absorber (2)

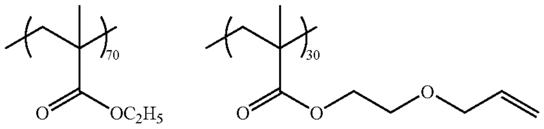

Binder Polymer (1)

Examples 10 to 18

Lithographic printing plate precursors were obtained in the same manner as in Example 9, except that each of the compounds shown in Table 2 was used in place of the copolymer represented by Compound Example 43.

Examples 19 and 20

Lithographic printing plate precursors were obtained in the same manner as in Example 1, except that each of the compounds shown in Table 3 was used in place of the copolymer represented by Compound Example 4.

TABLE 3

| | Copolymer | Copolymer composition (molar ratio), Weight-average molecular weight Mw |
|---|---|---|
| Example 19 | 69 | x/y/z/w = 20/10/40/30, Mw = 9000 |
| Example 20 | 70 | x/y/z/w = 20/20/40/20, Mw = 11000 |

Examples 21 and 22

Lithographic printing plate precursors were obtained in the same manner as in Example 9, except that each of the compounds shown in Table 4 was used in place of the copolymer represented by Compound Example 43.

TABLE 4

| | Copolymer | Copolymer composition (molar ratio), Weight-average molecular weight Mw |
|---|---|---|
| Example 21 | 66 | x/y/z/w = 20/20/50/10, Mw = 8000 |
| Example 22 | 70 | x/y/z/w = 20/20/40/20, Mw = 11000 |

Example 23

A coating fluid for overcoat layer formation which had the composition shown below was applied on the image-recording layer of the lithographic printing plate precursor of Example 8 by bar coating in a thickness of 0.5 g/$m^2$ on a dry basis. Thereafter, the coating was dried in an oven at 125° C. for 75 seconds to form an overcoat layer. Thus, a lithographic printing plate precursor was obtained.

| Coating Fluid for Overcoat Layer Formation | |
|---|---|
| Poly(vinyl alcohol) (PVA205, manufactured by Kuraray Co., Ltd.) | 1.0 g |
| Fluorochemical surfactant (1) shown above | 0.1 g |
| Water | 19.0 g |

Example 24

An overcoat layer was formed on the image-recording layer of the lithographic printing plate precursor of Example 18 in the same manner as in Example 23. Thus, a lithographic printing plate precursor was obtained.

2. Determination of Adsorbed Amount

A methanol solution of a copolymer (1% by weight) was prepared and the aluminum substrate produced in Example 1 was immersed therein for 10 minutes. Subsequently, this aluminum substrate was rinsed with methanol and then dried overnight by standing at room temperature. This aluminum substrate was set in a fluorescent X-ray analyzer (RIX 3000, manufactured by Rigaku Corp.) and the amount of the carbon contained in the copolymer adsorbed on the surface was determined.

The results obtained are shown in Table 5.

3. Exposure and Printing

Each of the lithographic printing plate precursors obtained in the Examples and Comparative Examples given above was exposed with Trendsetter 3244VX, manufactured by Creo Co., Ltd. and equipped with a 40 W infrared semiconductor laser of the water cooling type. The exposure was conducted under the conditions of an output of 9 W, outer-drum rotational speed of 210 rpm, and resolution of 2,400 dpi. The image to be formed through the exposure included a thin-line chart. Without being developed, the exposed plate precursor obtained was attached to the cylinder of printing machine SOR-M, manufactured by Heidelberg. A fountain solution (EU-3 (etchant manufactured by Fuji Photo Film Co., Ltd.)/water/isopropyl alcohol=1/89/10 (volume ratio)) and black ink TRANS-G(N) (manufactured by Dainippon Ink & Chemicals, Inc.) were supplied thereto. Thereafter, printing was conducted on 100 sheets at a printing speed of 6,000 sheets per hour.

The number of sheets of printing paper required before the unexposed areas of the image-recording layer were completely removed by development on the printing machine and came not to transfer the ink to the printing paper was counted as a measure of on-press developability. As a result, the number of sheets required before a printed matter free from scumming in nonimage areas came to be obtained was 100 or smaller with respect to each of the lithographic printing plate precursors.

4. Evaluation

In general, in negative lithographic printing plate precursors, a smaller exposure amount results in a lower degree of cure of the image-recording layer (photosensitive layer) and a larger exposure amount results in a higher degree of cure thereof. In case where the image-recording layer has cured in too low a degree, the lithographic printing plate has low printing durability and is poor in the ability to reproduce small dots or thin lines. In contrast, when the image-recording layer has cured in a high degree, the lithographic printing plate has high printing durability and is satisfactory in the ability to reproduce small dots or thin lines.

In the Examples, the negative lithographic printing plate precursors obtained above were evaluated for printing durability and thin-line reproducibility under the same exposure conditions described above by the methods shown below. These properties were used as indexes to the sensitivity of each lithographic printing plate precursor. Namely, the larger the number of printed sheets in printing durability and the smaller the width of the thin line in thin-line reproducibility, the higher the sensitivity of the lithographic printing plate precursor.

(1) Thin-Line Reproducibility

Printing on 100 sheets was conducted and a printed matter in which the nonimage areas were free from scumming was ascertained to have been obtained, as described above. Thereafter, printing on 500 sheets was continuously conducted. The thin-line chart (chart obtained through the exposure of thin lines of 10, 12, 14, 16, 18, 20, 25, 30, 35, 40, 60, 80, 100, and 200 μm) on the 600th printed matter from the beginning was examined with a magnifying lens having a magnification of 25 diameters. Thin-line reproducibility was evaluated in terms of the width of the thin line reproduced with the ink without breaking.

(2) Printing Durability

After printing for the evaluation of thin-line reproducibility was conducted in the manner described above, printing was further continued. As the number of printed sheets increased, the image-recording layer gradually wore and the ink-receiving properties thereof decreased. The ink density in the printing paper hence decreased. Printing durability was evaluated in terms of the number of printed sheets required for the ink density (reflection density) to decrease by 0.1 from the density as measured at printing initiation.

The results of these evaluations are shown in Table 5 together with the results of the on-press developability evaluation.

TABLE 5

| | Absorbed amount (mg/m$^2$) | logP | On-press developability (number of sheets) | Thin-line reproducibility (μm) | Printing durability (number of sheets) |
|---|---|---|---|---|---|
| Example 1 | 2.1 | — | 25 | 18 | 5500 |
| Example 2 | 1.8 | — | 25 | 18 | 6500 |
| Example 3 | 2.3 | — | 20 | 16 | 6200 |
| Example 4 | 2.2 | — | 25 | 18 | 5500 |
| Example 5 | 2.5 | 0.133 | 20 | 18 | 5800 |
| Example 6 | 2.1 | — | 25 | 16 | 6500 |
| Example 7 | 1.9 | 0.255 | 20 | 18 | 6000 |
| Example 8 | 2.1 | 0.66 | 20 | 18 | 6200 |
| Comparative Example 1 | — | — | 25 | 30 | 2500 |
| Example 9 | 2 | — | 30 | 20 | 6000 |
| Example 10 | 2.2 | — | 30 | 20 | 7500 |
| Example 11 | 2.3 | — | 30 | 20 | 6500 |
| Example 12 | 2.4 | 2.032 | 25 | 25 | 5800 |
| Example 13 | 2.3 | −1.058 | 25 | 20 | 6000 |
| Example 14 | 2.3 | — | 30 | 20 | 6500 |
| Example 15 | 1.9 | — | 30 | 25 | 7000 |
| Example 16 | 2.2 | — | 30 | 20 | 7500 |
| Example 17 | 2.5 | −1.058 | 25 | 20 | 6500 |
| Example 18 | 2.4 | 0.666 | 25 | 20 | 7000 |
| Comparative Example 2 | — | — | 45 | 40 | 2700 |
| Example 19 | 3.3 | −0.659 | 20 | 18 | 5500 |
| Example 20 | 3.1 | −0.659 | 20 | 18 | 6500 |
| Example 21 | 2.8 | 0.142 | 20 | 20 | 6000 |
| Example 22 | 2.7 | −0.659 | 25 | 20 | 7500 |
| Example 23 | — | — | 20 | 18 | 6500 |
| Example 24 | — | — | 25 | 20 | 8000 |

Table 5 clearly shows that the lithographic processes according to the invention, in which the lithographic printing plate precursors of the invention containing a specific copolymer are used, attain highly excellent thin-line reproducibility and printing durability as compared with the case in which lithographic printing plate precursors having no undercoat layer are used (Comparative Examples 1 and 2).

According to the invention, a lithographic printing plate precursor excellent in on-press developability and satisfactory in thin-line reproducibility and printing durability and a lithographic printing method for using the same can be provided.

The entire disclosure of each and every foreign patent application from which the benefit of foreign priority has been claimed in the present application is incorporated herein by reference, as if fully set forth.

What is claimed is:

1. A lithographic printing plate precursor comprising:

a support; and at least one layer comprising an image-recording layer, the image-recording layer comprising (A) an infrared absorber, (B) a radical polymerization initiator, (C) an addition polymerizable compound having at least two ethylenically unsaturated double bonds, and (D) a binder polymer, wherein the image recording layer is capable of being removed with at least one of a printing ink and a fountain solution, further wherein said at least one layer further comprises an undercoat layer formed between the support and the image-recording layer, the undercoat layer comprises a copolymer containing repeating units represented by the following formula (I):

$$-(A_1)_x-(A_2)_y-$$

wherein $A_1$ represents a repeating unit containing at least one ethylenically unsaturated bond, and $A_2$ represents a repeating unit containing at least one functional group interacting with the surface of the support, and x and y stand for copolymerizing ratios and each independently is from 5 to 80, wherein said copolymer comprises:

(a1) a unit comprising at least one ethylenically unsaturated bond, wherein the unit (a1) is represented by formula (A1):

(A1)

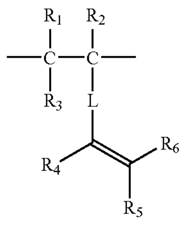

in which $R_1$ to $R_3$ each independently represents a hydrogen atom, an alkyl group having 1 to 6 carbons or a halogen atom;

$R_4$ to $R_6$ each independently represents a hydrogen atom, an alkyl group having 1 to 6 carbon atoms, a halogen atom, an acyl group, or an acyloxy group, wherein $R_5$ may be bonded to one of $R_4$ to $R_6$ to form a ring; and L represents a bivalent connecting group selected from the group consisting of L1: —CO—NH-(bivalent aliphatic group)-O—CO—, L2: —CO-(bivalent aliphatic group)-O—CO—, L3: —CO—O-(bivalent aliphatic group)-O—CO—, L4: -(bivalent aliphatic group)-O—CO—, L5: —CO—NH-(bivalent aromatic group)-O—CO—, L6: —CO-(bivalent aromatic group)-O—CO—, L7: -(bivalent aromatic group)-O—CO—, L8: —CO—O-(bivalent aliphatic group)-CO—O-(bivalent aliphatic group)-O—CO—, L9: —CO—O-(bivalent aliphatic group)-O—CO-(bivalent aliphatic group)-O—CO—, L10: —CO—O-(bivalent aromatic group)-CO—O-(bivalent aliphatic group)-O—CO—, L11: —CO—O-(bivalent aromatic group)-O—CO-(bivalent aliphatic group)-O—CO—, L12: —CO—O-(bivalent aliphatic group)-CO—O—(bivalent aromatic group)-O—CO—, L13: —CO—O-(bivalent aliphatic group)-O—CO—(bivalent aromatic group)-O—CO—, L14: —CO—O-(bivalent aromatic group)-CO—O—(bivalent aromatic group)-O—CO—, L15: —CO—O-(bivalent aromatic group)-O—CO—(bivalent aromatic group)-O—CO—, L16: —CO—O-(bivalent aromatic group)-O—CO—NH(bivalent aliphatic group)-O—CO—, L17: —CO—O-(bivalent aliphatic group)-O—CO—NH(bivalent aliphatic group)-O—CO—, wherein for each of L1-L17 the left side is bonded to the main chain and the right side is bonded to the ethylenically unsaturated bond, the bivalent aliphatic group means an alkylene group, substituted alkylene group, alkenylene group, substituted alkenylene group, alkynylene group, substituted alkynylene group, or polyalkyleneoxy group, and the bivalent aromatic group means an aryl group or a substituted aryl group; and (a2) a unit comprising at least one functional group interacting with a surface of the support, wherein the unit (a2) is represented by formula (A2):

(A2)

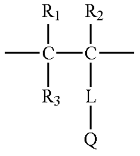

in which $R_1$ to $R_3$ each independently represents a hydrogen atom, an alkyl group having 1 to 6 carbon atoms, or a halogen atom;

L represents a bivalent connecting group selected from the group consisting of —CO—, —O—, —NH—, bivalent aliphatic groups, bivalent aromatic groups, and combinations of two or more of these; and Q represents a functional group interacting with the surface of the support, and wherein a proportion of (a1) is from 5 to 80% by mole based on all copolymer units and a proportion of (a2) is from 5 to 80% by mole based on all copolymer units;

wherein said copolymer further comprises (a3) a unit comprising at least one hydrophilic group represented by formula (A3):

(A3)

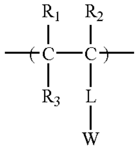

wherein $R_1$ to $R_3$ each independently represents a hydrogen atom, an alkyl group having 1 to 6 carbon atoms, or a halogen atom;

L represents a bivalent connecting group selected from the group consisting of —CO—, —O—, —NH—, bivalent aliphatic groups, bivalent aromatic groups, and combinations of two or more of these; and W represents the following groups:

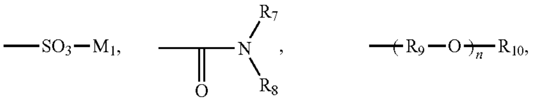

wherein $M_1$ represents a hydrogen atom, an alkali metal atom, an alkaline-earth metal atom, or an ammonium;

$R_7$ and $R_8$ each independently represents a hydrogen atom or a linear or branched alkyl group having 1 to 6 carbon atoms;

$R_9$ represents a linear or branched alkylene group having 1 to 6 carbon atoms;

$R_{10}$ represents a hydrogen atom or an alkyl group having 1 to 12 carbon atoms; and n represents an integer of 1 to 100; and wherein the proportion of the unit (a3) is from 5 to 80% by mole based on all copolymer units; and an amount of the copolymer in the undercoat layer is from 0.1 to 100 mg/m$^2$.

2. The lithographic printing plate precursor of claim 1, wherein a logP of the unit (a3) is from −3 to 3.

3. The lithographic printing plate precursor of claim 1, wherein the image-recording layer further comprises a microcapsule including at least one of (A) the infrared absorber, (B) the polymerization initiator, (C) the polymerizable compound, and (D) the binder polymer.

4. The lithographic printing plate precursor of claim 1, wherein (B) the polymerization initiator is at least one selected from the group consisting of an iodonium salt, a diazonium salt, and a sulfonium salt.

5. The lithographic printing plate precursor of claim 1, further comprising an overcoat layer on the image-recording layer, so as to comprise the support, the image-recording layer, and the overcoat layer, in this order, wherein the overcoat layer is capable of being removed with at least one of the printing ink and the fountain solution.

6. A lithographic printing method comprising:

mounting a lithographic printing plate precursor according to claim 1 on a printing press;

imagewise exposing the lithographic printing plate precursor with an infrared laser beam; and feeding a printing ink and a fountain solution to the lithographic printing plate precursor to remove an infrared non-exposed area in the image recording layer.

7. The lithographic printing method of claim 6, wherein the mounting is performed before the imagewise exposing.

8. The lithographic printing method of claim 6, wherein the mounting is performed after the imagewise exposing.

9. The lithographic printing plate precursor of claim 1, wherein Q is an ammonium salt group, a pyridinium salt group, a phosphate group, a phosphono group, a boric group or an acetylacetone group.

10. The lithographic printing plate precursor of claim 1, wherein the copolymer has a property of being absorbed onto an anodized film of an aluminum in an amount of 0.1 mg/m$^2$ or larger, and wherein the copolymer further has (a3) a unit comprising at least on hydrophilic group.

11. The lithographic printing plate precursor of claim 1, wherein the proportion of (a1) is from 10 to 50% by mole based on all copolymer units and the proportion of (a2) is from 10 to 50% by mole based on all copolymer units.

12. The lithographic printing plate precursor of claim 1, wherein L in formula (A1) is L1, L3, L5, L7 or L17.

13. The lithographic printing plate precursor of claim 12, wherein W in formula (A3) is $—SO_3—M_1$ or $—(R_9—O)_n—R_{10}$.

14. The lithographic printing plate precursor of claim 12, wherein an amount of the copolymer in the undercoat layer is from 3 to 30 mg/m$^2$.

15. The lithographic printing plate precursor of claim 1, wherein W in formula (A3) is $—SO_3—M_1$ or $—(R_9—O)_n—R_{10}$.

16. The lithographic printing plate precursor of claim 1, further comprising an overcoat layer on the image-recording layer, so as to comprise the support, the image-recording layer, and the overcoat layer, in this order, wherein the overcoat layer is capable of being removed with at least one of the printing ink and the fountain solution, wherein (B) the polymerization initiator is at least one selected from the group consisting of an iodonium salt, a diazonium salt, and a sulfonium salt.

17. The lithographic printing plate precursor of claim 1, wherein $R_{10}$ is a methyl group.

* * * * *